(12) United States Patent
Henley

(10) Patent No.: US 8,222,119 B2
(45) Date of Patent: Jul. 17, 2012

(54) APPARATUS AND METHOD OF TEMPERATURE CONTROL DURING CLEAVING PROCESSES OF THICK MATERIALS

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 13/246,717

(22) Filed: Sep. 27, 2011

(65) Prior Publication Data

US 2012/0077289 A1  Mar. 29, 2012

Related U.S. Application Data

(62) Division of application No. 12/019,110, filed on Jan. 24, 2008, now abandoned.

(60) Provisional application No. 60/886,912, filed on Jan. 26, 2007.

(51) Int. Cl.
*H01L 21/30* (2006.01)
*H01L 21/425* (2006.01)
*H01L 21/306* (2006.01)
*C23F 1/00* (2006.01)

(52) U.S. Cl. .............. 438/459; 156/345.51; 156/345.52; 156/345.53; 156/345.54; 156/345.55; 438/514; 438/515; 438/532; 250/284

(58) Field of Classification Search ............ 156/345.51–345.55; 438/455, 438/458, 459, 514, 515, 532; 315/500–507; 250/281–300; 118/728–730; 125/12–22; 451/365–387

See application file for complete search history.

(56) References Cited

U.S. PATENT DOCUMENTS

| | | | |
|---|---|---|---|
| 4,903,681 A * | 2/1990 | Honda et al. ............... | 125/13.01 |
| 2001/0018271 A1* | 8/2001 | Yanagisawa .................. | 438/697 |
| 2002/0053318 A1* | 5/2002 | Levy et al. ..................... | 117/88 |

* cited by examiner

*Primary Examiner* — Michael Lebentritt
*Assistant Examiner* — Karen Kusumakar
(74) *Attorney, Agent, or Firm* — Kilpatrick Townsend and Stockton LLP

(57) ABSTRACT

A method for temperature control during a process of cleaving a plurality of free-standing thick films from a bulk material includes clamping a bulk material using a mechanical clamp device adapted to engage the bottom region of the bulk material through a seal with a planar surface of a stage to form a cavity with a height between the bottom region and the planar surface. The planar surface includes a plurality of gas passageways allowing a gas filled in the cavity with adjustable pressure. The method also includes maintaining the temperature of the surface region by processing at least input data and executing a control scheme utilizing at least one or more of:

- particle bombardment to heat the surface region;
- radiation to heat the surface region; and
- gas-assisted conduction between the bottom region and the stage.

54 Claims, 18 Drawing Sheets

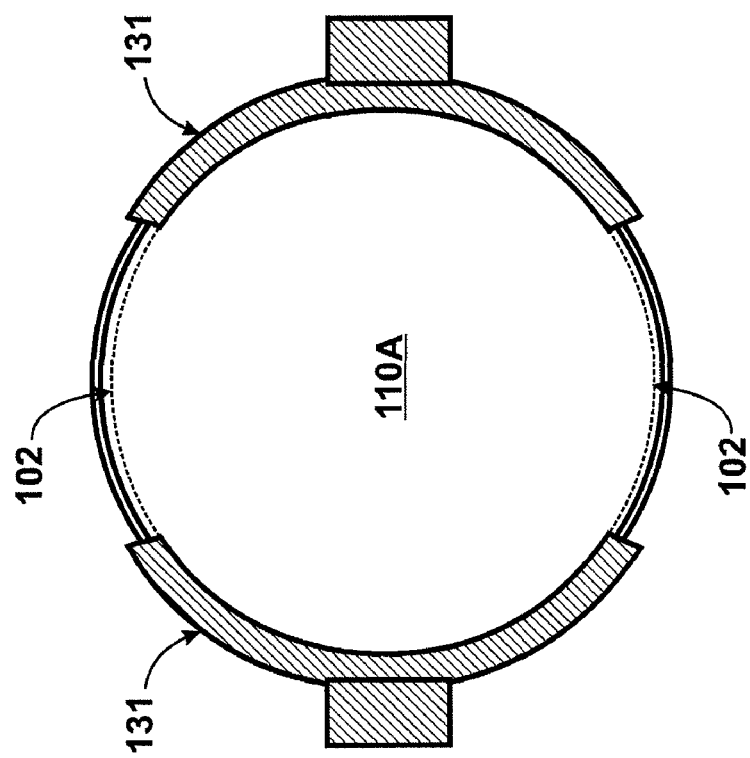
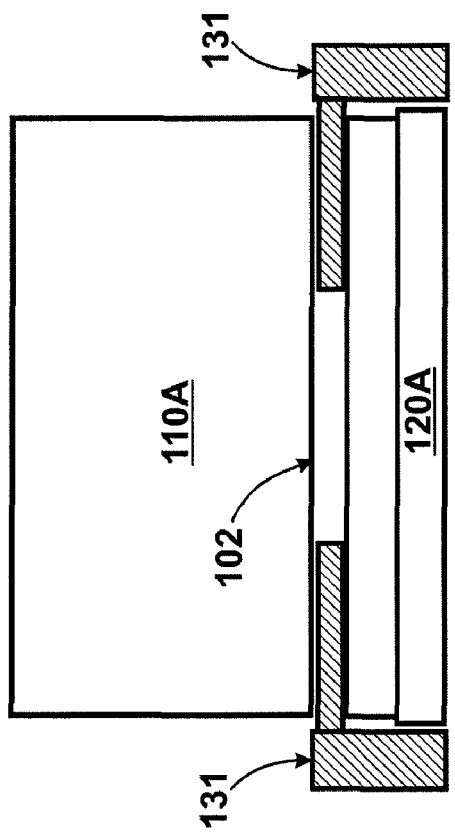

APPARATUS AND METHOD OF TEMPERATURE CONTROL DURING CLEAVING PROCESSES OF THICK MATERIALS

CROSS-REFERENCE TO RELATED APPLICATION

The instant nonprovisional patent application is a divisional application of U.S. patent application Ser. No. 12/019,110, filed Jan. 24, 2008, which claims priority to U.S. Provisional Patent Application No. 60/886,912, filed Jan. 26, 2007, both of which are incorporated by reference in their entirety herein for all purposes.

BACKGROUND OF THE INVENTION

The present invention relates generally to techniques including methods and apparatuses for manufacturing materials. More particularly, the present methods and apparatuses include a temperature control for cleaving free-standing thick films from material in bulk form, such as a silicon ingot. Such free-standing thick films are useful as a photovoltaic material such as a solar cell. But, it will be recognized that embodiments in accordance with the present invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, semiconductor substrate manufacturing, biological and biomedical devices, and the like.

From the beginning of time, human beings have relied upon the sun to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. While these polysilicon plates may be formed in a cost effective manner, they do not exhibit the highest possible efficiency in capturing solar energy and converting the captured solar energy into usable electrical power. By contrast, single crystal silicon (c-Si) exhibits suitable properties for high grade solar cells. Such single crystal silicon is, however, expensive to manufacture and difficult to use for solar applications in an efficient and cost effective manner. In particular, techniques for manufacturing single crystal silicon substrates for incorporation into solar cells involves the separation of single crystal silicon thick films from a single crystal silicon ingot originally grown.

From the above, it is seen that improved techniques for the manufacture of free-standing thick films for integrated circuit device applications including solar cells, are desirable.

BRIEF SUMMARY OF THE INVENTION

Embodiments in accordance with the present invention relate generally to techniques including methods and apparatuses for temperature control during cleaving free-standing thick films from material in bulk form, such as a silicon ingot. Such free-standing thick films are useful as a photovoltaic material such as a solar cell. But, it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, semiconductor substrate manufacturing, biological and biomedical devices, and the like.

A free-standing thick film of semiconductor material having a thickness of 15 μm or greater, may be cleaved from a bulk material utilizing implantation of an ionic species at a desired surface temperature. In an embodiment, the cleaving involves removably holding the bulk material through a seal on a temperature controlled stage using a mechanical clamp device, then implanting particles such as ions at a first, lower temperature to create a cleave region, and then implanting particles such as ions at a second, higher temperature to enhance stress in the cleave region. In another embodiment, the seal between the temperature controlled stage and the bottom of the bulk material creates a thin cavity capable of filling a gas with adjustable pressure. In yet another embodiment, by adjusting the gas pressure in the thin cavity the heat transfer from the surface to bottom of the bulk material and further the surface temperature for implanting are controlled. In certain embodiments, the bottom of the bulk material is glued (e.g. using thermally conductive glue or thermally conductive epoxies) to a thermal and mechanical adapter plate which can facilitate the mounting and handling of the bulk material. Depending upon the particular embodiment, the adapter plate can be slightly larger than, smaller than, or the same size in cross section as, the bulk material. In accordance with certain embodiments, the adapter plate can be reused on other bulk substrates. The resulting cleaved free-standing thick films of semiconductor material such as single crystal silicon, are particularly suited for use in the collection of solar energy.

In a specific embodiment, the invention provides an apparatus for temperature control of manufacture of thick film materials. The apparatus includes a stage comprising a planar surface for supporting a bulk material to be implanted. The bulk material includes a surface region, a side region, and a bottom region. The side region, bottom region, and the surface region provide a volume of material which has a length defined between the bottom region and the surface region. The apparatus further includes a mechanical clamp device adapted to engage the bottom region of the bulk material to the planar surface of the stage such that the bulk material is in physical contact with the planar surface for thermal energy to transfer through an interface region between the bulk material and the planar surface of the stage while the surface region of the bulk material is substantially exposed. Additionally, the apparatus includes a sensor device configured to measure a temperature value of the surface region. The sensor device is adapted to generate an input data. Moreover, the apparatus includes an implant device configured to perform implantation of a plurality of particles through one or more portions of the surface region of the bulk material. Furthermore, the apparatus includes a controller configured to receive the input data and process the input data to increase and/or decrease the temperature value of the surface region of the bulk material through at least the interface region between the planar surface of the stage and the bottom region of the bulk material.

In another specific embodiment, the invention provides an apparatus of mounting a bulk material for manufacture of one or more thick films. The apparatus includes a stage comprising a planar surface for supporting the bulk material. The bulk material includes a planarized surface region, a planarized end region, and a side region having a length from the surface region to the end region. The apparatus further includes a mechanical clamp device adapted to engage the planarized end region of the bulk material with the planar surface of the stage such that the surface region and at least 70% length of the side region from the surface region is substantially exposed and can be cleaved for manufacture of one or more thick films without interference of the clamp device.

In yet another specific embodiment, the invention provides a method for temperature control during a process of cleaving a plurality of free-standing thick films from a bulk material. The method includes providing a bulk material for cleaving. The bulk material includes a surface region, a bottom region, a side region having a length from the surface region to the bottom region. Additionally, the method includes clamping the bulk material using a mechanical clamp device adapted to engage the bottom region of the bulk material through a seal with a planar surface of a stage to form a cavity with a height between the bottom region and the planar surface. The planar surface includes a plurality of gas passageways allowing a gas filled in the cavity with adjustable pressure. The method further includes sensing the state of the bulk material to generate an input data. The input data includes temperature information at the surface region and the bottom region and the length of the bulk material between the surface region and the bottom region. Moreover, the method includes maintaining the temperature of the surface region by processing at least the input data and executing a control scheme utilizing at least one or more of particle bombardment to heat the surface region, radiation to heat the surface region and gas-assisted conduction between the bottom region and the stage.

In still another specific embodiment, the invention provides a method for processing semiconductor materials for thick film transfer. The method includes providing a bulk semiconductor material onto a planar surface of a stage. The bulk semiconductor material includes a surface region, a side region, and a bottom region. The side region, bottom region, and the surface region provide a volume of material which has a length defined between the bottom region and the surface region. The bottom region couples to the planar surface of the stage. Additionally, the method includes securing the bulk semiconductor material using a mechanical clamp device adapted to engage the bottom surface of the bulk material to the planar surface of the stage such that the bulk material is in physical contact with the planar surface to cause thermal energy to transfer between the bulk material and the planar surface of the stage while the surface region of the bulk material is substantially exposed. Moreover, the method includes processing the surface region of the bulk material while the surface region is substantially exposed and maintained on the planar surface of the stage with the mechanical clamp device.

In still yet another embodiment, the invention provides a method for progressively cleaving free-standing films from a bulk material. The method includes securing the bulk material on a stage using a mechanical clamp device. The bulk material has a surface region, a side region, and a bottom region. The surface region is continuous with the side region and oriented at an angle of about 90 Degrees from the side region to define a volume. The mechanical clamp device is adapted to couple with the bottom region and/or the side region of the bulk material so that the bottom region is firmly engaged with the stage. Additionally, the method includes maintaining the surface region substantially free from any physical interference in a direction normal to the surface region. The method further includes processing at least the surface region while the surface region is substantially free from any physical interference from the processing of the surface region. Moreover, the method includes selectively maintaining a temperature of the surface region during the processing of the surface region.

According to certain embodiments, the bottom region of the bulk material opposite to the surface region, can be contacted thermally and mechanically through an adapter or interface plate. The bulk material could be secured to such an adapter plate using glue or other techniques, with an opposing face of the plate mounted onto the temperature controlled stage. Particular embodiments of the adapter plate can also allow for clamp mounting. In such an embodiment, the adapter plate with clamp mounting eliminates the requirement to clamp the bulk material directly, and improves utilization of the bulk material by allowing the bulk material to be cleaved closer to the bottom region.

Use of an adapter plate according to embodiments of the present invention could also desirably relax the planarization tolerances of the bulk material bottom region and thus reduce costs. For example, under certain conditions the bottom of the ingot can be slightly uneven. However, this unevenness can be offset by the attachment between the adapter and susceptor. In particular, the adapter can have pins or seats to help align the ingot to it.

In a specific embodiment, the side of the adapter plate in contact with the bulk material, can have a recessed region configured to receive a part of a sealing member. Such a sealing member can be an o-ring made, for example, of a suitable material (e.g., Kalrez™ by DuPont Performance Elastomers L.L.C.), which is disposed within a vicinity of an edge region of the adapter plate. In a particular embodiment, glue can be applied within an interior region of the edge region, while the o-ring seals and maintains the glue material within the interior region.

According to specific embodiments, electrical conductivity can be provided between the adapter plate and the bulk material. Seating pins or other types of connection devices can be spatially disposed within the interior region defined within an o-ring, or within an interior region of a specific embodiment of a chuck lacking an o-ring. Such seating pins can electrically and mechanically couple the bulk material with the adapter.

Numerous benefits may be achieved over pre-existing techniques using embodiments of the present invention. In particular, embodiments of the present invention use a cost effective linear accelerator device and method for providing a high energy implant process for layer transfer techniques. Such linear accelerator device may include, but is not limited to, a drift tube technique, a Radio Frequency Quadrupole, commonly called RFQ, or combinations of these, (for example, a RFQ combined with a Drift Tube Linac or a RFI (RF-Focused Interdigital) Linear Accelerator), DC accelerators, and other suitable techniques. An example of a linear accelerator can be found in U.S. Provisional Application No. 60/864,584 commonly assigned, and hereby incorporated by reference for all purposes. In a preferred embodiment, the present method and device forms a thickness of transferable material defined by a cleave plane in a donor substrate. The thickness of transferable material may be further processed to provide a high quality semiconductor material for application such as photovoltaic devices, 3D MEMS or integrated circuits, IC packaging, semiconductor devices, any combination of these, and others. In a preferred embodiment, the present method provides for single crystal silicon for highly efficient photovoltaic cells among others. In a preferred embodiment, the present method and structure use a low initial dose of energetic particles, which allows the process to be cost effective and efficient. Additionally, the present method and structure allow for fabrication of large area substrates. It will be found that this invention can be applied to make thin silicon material plates of the desired form factor (for example, 50 µm-200 µm thickness with a area size from 15 cm×15 cm to upwards of 1 m×1 m or more for polysilicon plates). In an alternative preferred embodiment, embodiments according to the present invention may provide for a seed layer that can further provide for layering of a hetero-structure epitaxial process. The hetero-structure epitaxial process can be used to form thin multi junction photovoltaic cells, among others. Merely as an example, GaAs and GaInP layers may be deposited heteroepitaxially onto a germanium seed layer, which is a transferred layer formed using an implant process according to an embodiment of the present invention. In a specific embodiment, the present method can be applied successively to cleaving multiple slices from a single ingot, e.g., silicon boule. That is, the method can be repeated to successively cleave slices (similar to cutting slices of bread from a baked loaf) according to a specific embodiment. In a preferred embodiment, the present invention provides a clamping and/or holding device and related method for securing a bulk silicon ingot for mechanical and thermal purposes. Of course, there can be other variations, modifications, and alternatives.

These and other benefits may be described throughout the present specification and more particularly below.

BRIEF DESCRIPTION OF THE DRAWINGS

FIG. 2A shows a simplified cross section view of a bulk material being held on a stage by a mechanical clamp device via grooves the side region according to an embodiment of the present invention.

FIG. 2B shows a simplified top view of a bulk material with circular cross section shape being clamped by a mechanical clamp device according to an embodiment of the present invention.

DETAILED DESCRIPTION OF THE INVENTION

Figure 1:
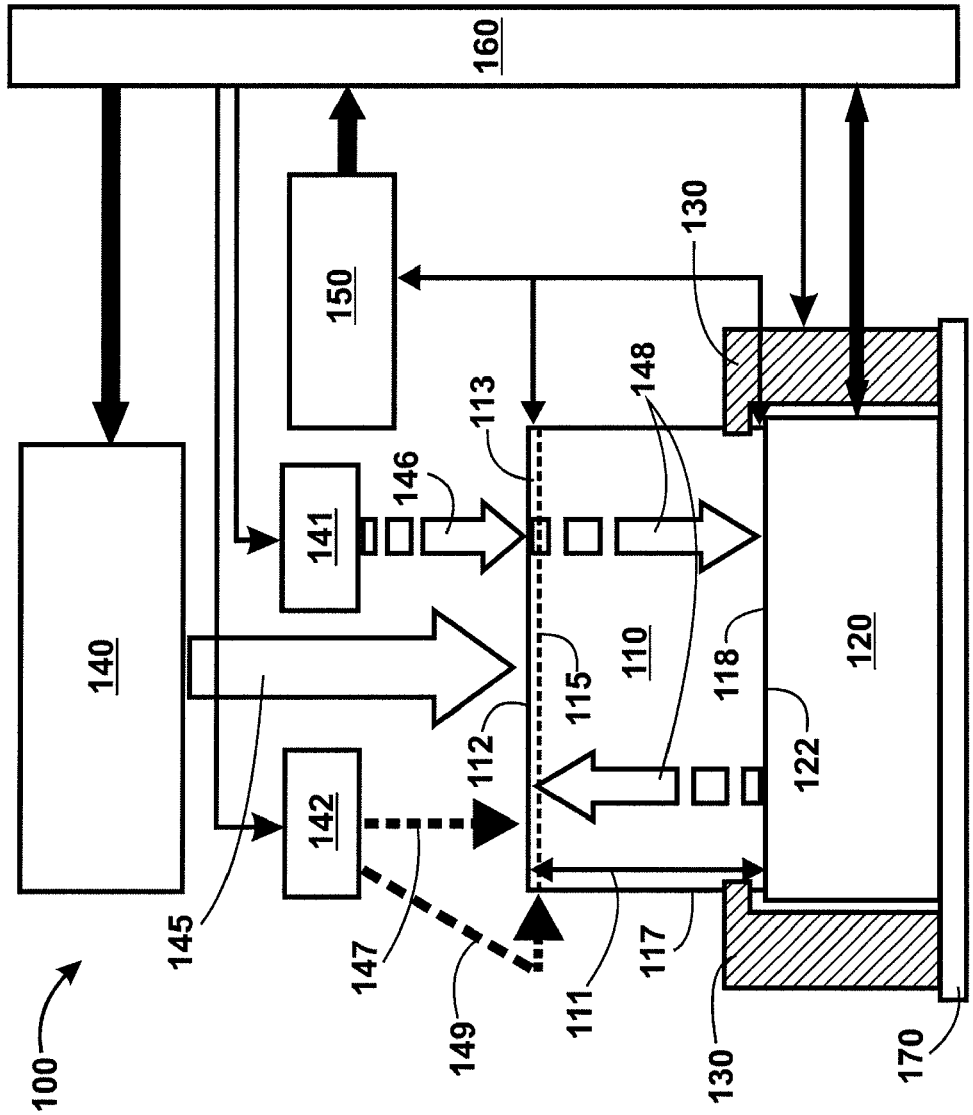
FIG. 1 shows a simplified view of an apparatus for temperature control of manufacture of thick film materials in accordance with an embodiment of the present invention.

The present invention relates generally to techniques including methods and apparatuses for manufacturing materials. More particularly, the present methods and apparatuses include a temperature control for cleaving free-standing thick films from material in bulk form, such as a silicon ingot. Such free-standing thick films are useful as a photovoltaic material such as a solar cell. But, it will be recognized that embodiments in accordance with the present invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, semiconductor substrate manufacturing, biological and biomedical devices, and the like.

As used herein, the term "bulk material" can refer to a predominantly homogenous piece of single crystal or polycrystalline material standing alone, for example a single crystal silicon boule or a portion thereof. Alternatively, for purposes of the instant patent application the term "bulk material" can also refer to the predominantly homogenous single crystal or polycrystalline material in conjunction with one or more additional elements, for example the various adapter plate embodiments described below, as well as any o-rings or other elements employed to secure such an adapter plate to the predominantly homogenous single crystal or polycrystalline material.

A free-standing thick film of semiconductor material having a thickness of 15 μm or greater, may be cleaved from a bulk material utilizing implantation of an ion ionic species at MeV energy level. In one embodiment, the cleaving involves implanting ions at a first, lower temperature to create a cleave region, and then implanting ions at a second, higher temperature to enhance stress in the cleave region. Cleaving the bulk material in this manner substantially reduces the amount of semiconductor material that is conventionally lost to the kerf of a blade or wire cut. The resulting cleaved free-standing thick film of semiconductor material, such as single crystal silicon, is particularly suited for the collection of solar energy.

For purposes of the following disclosure, a "free-standing thick film" is defined as a film of material that can maintain its structural integrity (i.e. not crumble or break apart), without being in contact with a supporting member such as a handle or transfer substrate and/or requiring mechanical support from the supporting member. Typically, thin films (for example silicon films having a thickness of 5-10 μm and thinner) are unable to be handled without breaking Conventionally, such thin films are manipulated using a supporting structure, which may also be needed to create the thin film in the first place. Handling of thicker films (e.g. silicon films having a thickness of 15-50 μm) may be facilitated by the use of a support, but such a support is not mandatory. Accordingly embodiments of the present invention relate the fabrication of free-standing thick films of silicon having a thickness of greater than 15 μm.

In order to ensure the free-standing thick films with thickness up to 150 μm being successfully removed by a controlled cleaving process from a cleave region created by ion implantation, a well controlled temperature of the bulk material may be desirable according to a specific embodiment. Particularly the optimum temperature control can be achieved by balancing one or more heat sources and/or sinks of thermal power during the implantation and cleaving process. Further details of the temperature control can be found throughout the present specification and more particularly below.

Most of the thermal power management involved is CW (steady-state) thermal power according to a specific embodiment. The CW power flux sources and/or sinks can be one or more of the following (i) a temperature-controlled stage with a planar surface appropriately engaged with the bulk material through a high thermal conductivity backside contact, i.e., heating or cooling through a gas-layer interface region; (ii) an IR heating source by forcing a current to flow through the bulk material volume (such as electromagnetic inductive heating source); and (iii) floodlight or other appropriate CW radiant source for heating the surface from above, and any combinations of the above. Of course, someone of ordinary skill in the art would recognize other variations, modifications, and alternatives.

In a specific embodiment, the purpose of these CW sources or sinks will be to set the desired range of the treatment zone of the bulk material, defined as the cleave region and the silicon layer overlying the cleave region, as accurately and quickly as possible. These thermal sources or sinks can be controlled through surface and bulk temperature measurement via electronic controller to achieve the desired overall thermal profile for the treatment zone. Of course, someone of ordinary skill in the art would recognize other variations, modifications, and alternatives.

An additional thermal power source is the implant irradiation itself according to a specific embodiment. A conventional implant device may deliver 50-100 kW of beam power to the surface under irradiation. This is a substantial additional heating source during the cleave region formation by implantation. The cleave region essentially includes relatively concentrated defect networks around a cleave plane located near the End-Of-Range (EOR) of the implanted high energy ionic particles high energy ionic particles where the kinetic energy of the implanted particles is partially transferred to thermal energy. This thermal source can be a scanned CW or pulsed thermal source and can be partially controlled by adjusting the duty factor of the implant device and the scanning speed and spatial characteristics of the particle beam. Beam expansion can occur by rapid electromagnetic scanning but can also occur through drift of the beam over a distance where the beam will naturally expand to the desired beam diameter and beam flux spatial distribution.

If the power flux is low enough, slow scanning (or even no scanning) of the expanded beam can occur without surface overheating. With a smaller beam diameter such as 5 cm for example (which is useful for generating patterned implant dose profiles within each tile), the power flux can be as high as 5-10 kw/cm$^2$ and may require magnetic or electrostatic fast scanning to avoid surface overheating. Implant radiation can be combined with other forms of energy according to a specific embodiment.

Furthermore, the surface can also be treated through a pulsed thermal power flux in a specific embodiment. Pulsed power is defined here as a thermal pulse delivered within a thermal time constant depending on particular material and film thickness to be cleaved. For example, for a typical silicon treatment zone, the time constant is estimated to be 20-50 μsec. Longer thermal pulses are quasi-CW and would be combined as a CW source mentioned above. The pulsed power flux sources may include flash lamps and pulsed laser sources with energies deposited within 30-50 μsec. The thermal pulses delivered by these sources can instantaneously heat the treatment zone up to and past the melting point of the bulk material if desired.

The effect contemplated by this treatment is to add shear stresses onto the cleave region under formation to lower its cleave energies. More specifically, because the thermal conductivity within an implant EOR is significantly degraded, a temperature difference is generated across the cleave plane. The temperature differential causes a CTE (coefficient of thermal expansion) mismatch between the materials across the cleave plane and a corresponding shear stress. The shear stress adds to internal stress present due to the way of holding the bulk material on the stage and other stress such as silicon displacement stresses.

The stresses are in-plane stresses (along the X-Y surface of the cleave plane) and if the cleave plane is heated, the stresses are compressive in-plane stresses. These in turn produce out-of-plane tensile stresses in an amount proportional to the in-plane stress multiplied by the Poisson Ratio (about 0.27 for silicon). This stress value can be quantified by the following relation:

$$\sigma = E\alpha\Delta T$$

where σ is the stress across the cleave region, E is Young's Modulus, α is the coefficient of thermal expansion and ΔT is the temperature difference across the cleave plane. Assuming a thermal power flux density of $P_a$ in Watts/cm$^2$, the following relationship holds:

$$P_a = \kappa_{cr} \Delta T / t_{cr}$$

where $\kappa_{cr}$ is the effective thermal conductivity of the cleave region and $t_{cr}$ is the thickness of the cleave region. The stress across the film can be further expressed as following equation:

$$\sigma = (E\alpha t_{cr} P_a \beta) / \kappa_{bulk}$$

where β is the conductivity reduction factor for the cleave region relative to the bulk material. Therefore, the stress value is driven by the power flux $P_a$ and increases with a reduced thermal conductivity in terms of a factor β which depends on the amount of implant EOR damage. For example, if the bulk material is a Silicon ingot, β may be as large as 100.

The treatment by using the pulsed power flux to increase shear stress may effectively lower the implant dose required to facilitate the cleaving process and simultaneously help anneal bulk radiation defects. Of course, there can be other variations, modifications, and alternatives.

FIG. 1 shows a simplified diagram of an apparatus of temperature control for manufacture of the thick film materials in accordance with an embodiment of the present invention. This figure is merely an example, which should not unduly limit the scope of the claims. One of ordinary skill in the art would recognize many variations, alternatives, and modifications. As shown in FIG. 1, apparatus 100 for temperature control includes a stage 120, a mechanical clamp device 130, an implant device 140, a sensor device 150, and a controller 160. The stage 120 with a planar surface 122 is used to support the bulk material 110 to be cleaved. The bulk material 110 to be implanted and cleaved can be characterized by a surface region 112 including the treatment zone consisting of the cleave plane 115 and the overlying film of undetached silicon material 113, a side region 117, a bottom region 118, a length 111 defined from the surface region 112 to the bottom region 118. More details about the bulk material for processing will be described later.

As shown in FIG. 1 in one embodiment, the planar surface 122 of the stage 120 is engaged with the bottom region 118 of the bulk material 110, utilizing a mechanical clamp device 130. The clamping by the mechanical clamp device 130 is removably applied in such a way that the surface region 112 as well as the side region 117 with at least 70% of the length 111 (from the surface region) of the bulk material are substantially exposed and ready to be cleaved for manufacture of one or more free-standing thick films. For example, optional clamping mechanisms according to certain embodiments are illustrated in FIGS. 2A-2F. In one embodiment, both the stage 120 and the mechanical clamp device 130 may be mounted on a tray 170 that is two-dimensionally movable in a plane parallel to the planar surface 122 of the stage. In another embodiment, the stage 120 is used for temperature control of the bulk material as one of the CW power flux source or sink. By heating or cooling the engaged bottom region 118 of the bulk material via a high thermal conductivity gas-layer interface region between the bottom region of the bulk material and the planar surface of the stage, the stage 120 is capable of changing the thermal flux 148 from the surface region 112 during the cleaving process. Alternatively, an inductive Joule heating source can be applied in the apparatus 100 by forcing a current through the bulk material 110 volume via the mechanical clamp device 130.

Referring to the FIG. 1, the implant device 140 is used to form a cleave region 115 by introducing ionic particles in MeV energy level with a certain power flux 145 to the surface region 112 of the bulk material. The implant device 140, due to the power flux 145 from particle bombardment on the surface region, also can be used for temperature control by adjusting the duty factor of the implant device 140 to tune the particle power flux. In one embodiment, one or more CW thermal sources 141 such as floodlight located above the surface region can be used to provide additional controllable radiant heat flux 146. In another embodiment, one or more pulsed power flux source 142 can also be used to provide pulsed thermal flux towards the surface region 112 or specifically to the cleave region (from the side region) to add shear stress to facilitate cleaving.

The sensor device 150 comprises a plurality of sensors including temperature sensor, position sensor, pressure sensor, and surface roughness probe. At a given time point when the bulk material 110 is held on to the stage 120 and during the implantation processes, the sensor device 150 is capable of collecting all sensor data related to the state of the bulk material 110 at that time point. The sensor data recorded by the sensor device will be delivered to the controller 160 and be used as an input data for executing a feedback/feedforward control scheme to determine a control routine to change and maintain the temperature of the bulk material to an recipe value for implantation and subsequent cleaving process.

Figure 1A:
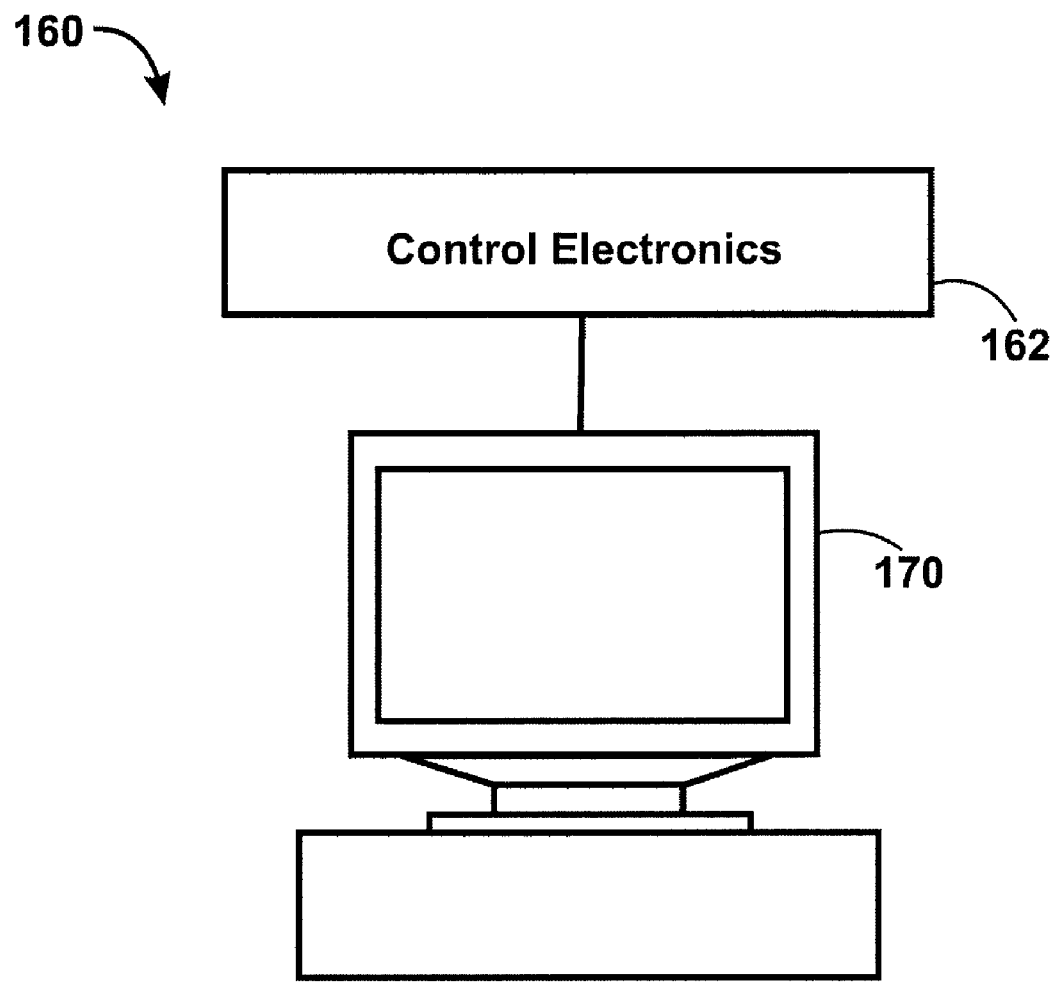
FIG. 1A shows a simplified view of a controller included in the apparatus of FIG. 1 in accordance with an embodiment of the present invention.

FIG. 1A is a simplified diagram of a controller 160 that is used to oversee and perform operation of the apparatus 100 of FIG. 1 as well as processing of information according to an embodiment of the present invention. This diagram is merely an example, which should not unduly limit the scope of the claims herein. One of ordinary skill in the art would recognize many other modifications, alternatives, and variations. As shown, the controller 160 includes control electronics 162 which links a computer system 170.

In a specific embodiment, the controller 160 uses the control electronics 162 to execute plurality of control functions. For example, the control electronics 162 includes multiple electronic boards or function cards. Each of those boards may be respectively adapted to couple the stage 120 to perform temperature control function, to couple the mechanical clamp device 130 to clamp or unclamp the bulk material 110, to couple the implant device 140 for implantation process, to couple external heat source (such as CW source 141 and pulsed source 142) for both temperature control and assisting the cleave process, and to couple the sensor device 150 to receive the information related to current state of the bulk material and generate an input data packet for the computer system 170.

Figure 1B:
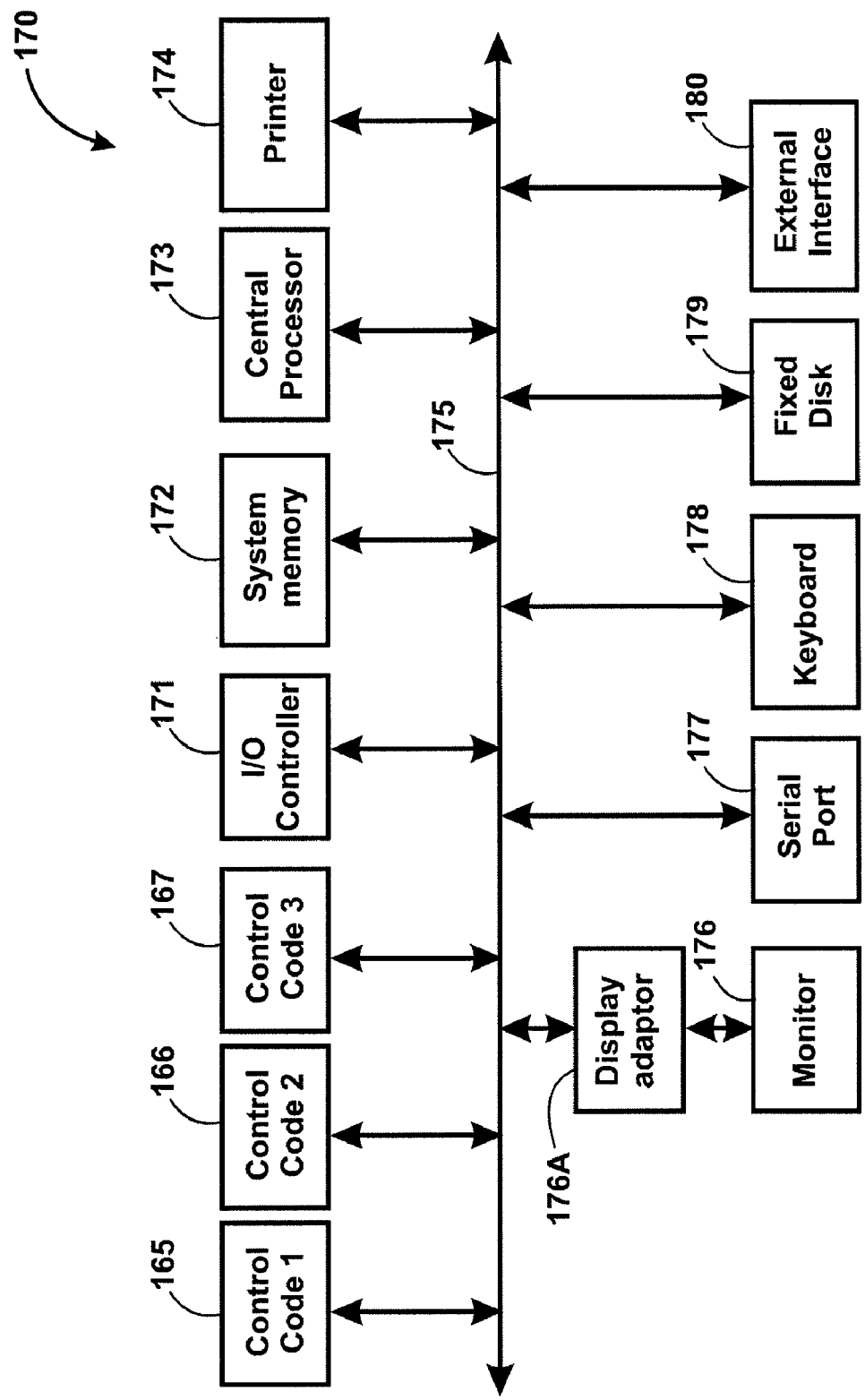
FIG. 1B shows a more detailed diagram of subsystems in the computer system included in the controller of FIG. 1A in accordance with an embodiment of the present invention.

In another specific embodiment, the computer system 170 may be a Pentium™ class based computer, running Windows™ NT operating system by Microsoft Corporation. However, the computer system is easily adapted to other operating systems and architectures by those of ordinary skill in the art without departing from the scope of the present invention. FIG. 1B is a more detailed diagram of hardware elements in the computer system 170 of FIG. 1A according to an embodiment of the present invention. This diagram is merely an example, which should not unduly limit the scope of the claims herein. As shown, the computer system 170 is configured to receive the input sensor data via an I/O controller 171, to process the data in a plurality of control codes 165, 166, 167, running in a central processor 173, and to send the output control commands/instructions back to the control electronics via I/O controller 171. Each of the plurality of control codes is specifically designed for certain control functions in the apparatus 100. For example, the control code 165 running in the computer system 170 may be a program for controlling the operation of the implant device to deliver certain high-energy ionic particle beams towards the surface region of the bulk material. In another example, the control code 166 may be a program to generating a sample handling procedure to be performed by the mechanical clamp device or a sample monitoring scheme to be executed by the sensor device. In yet another example, the control code 167 may be a program capable of generating output commands for cooling of the stage, adding Joule heat through the clamp, and/or heating the surface by the external heat sources etc. Of course, one of ordinary skill in the art would recognize many other modifications, alternatives, and variations.

In specific embodiments, all the hardware elements or subsystems of the computer system 170 are interconnected via a system bus 175. For example, subsystems such as a printer 174, keyboard 178, fixed disk 179, monitor 176, which is coupled to display adapter 176A, and others are shown. Peripherals and input/output (I/O) devices, which couple to I/O controller 171, can be connected to the computer system by any number of means known in the art, such as serial port 177. For example, serial port 177 can be used to connect the computer system to an external interface 180 such as a modem, which in turn connects to a wide area network such as the Internet, a mouse input device, or a scanner. The interconnection via system bus 175 allows central processor 173 to communicate with each subsystem and to control the execution of instructions from system memory 172 or the fixed disk 179, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of the functionality of the present invention can be outlined below according to the Figures.

FIGS. 2A and 2B show simplified views of a bulk material being held on a stage by a mechanical clamp device via grooves the side region according to an embodiment of the present invention. These figures are merely examples, which should not unduly limit the scope of the claims. One of ordinary skill in the art would recognize many variations, alternatives, and modifications. The bulk material 110A may be pre-processed, in addition to have a surface region planarized for facilitating implantation, to have one or more grooves on the side region configured to receive the mechanical clamp device so that the bulk material can be securely held on the stage 120A. FIG. 2A shows a simplified side view of a groove surrounding the peripheral side region and two clamping arms of the mechanical clamp device adapted to the grooves to clamp the bulk material. FIG. 2B shows a simplified top view of the same bulk material as shown in FIG. 2A being clamped, assuming that the bulk material has a circular cross-sectional shape.

In accordance with an embodiment of the present invention, the bulk material 110A may be prepared to have a desired length from the surface region to the bottom region. As shown in FIG. 2A, in a specific embodiment, the positions of the bulk material 110A being clamped by the mechanical clamp device 131 are located (on the side region) near the bottom region so that at least 70% part of the bulk material, including the surface region and the side region in at least 70% of length from the surface region, is substantially exposed for processing without the interference of the mechanical clamp device. The length of the bulk material, depending on the material type, may be pre-determined based on the capability of handling the thermal mass and heat transfer by a particular apparatus 100. The length of the bulk material also determines, depending on the film thickness, how many free-standing films can be yielded from cleaving the bulk material.

For example, the bulk material 110A may be a single crystal silicon ingot that exhibits an original length of 5 cm and has lateral dimensions of 15 cm×15 cm (with a weight of about 3 kg). In one embodiment, cleavage of about 70% of the length of such an ingot, utilizing techniques according to embodiments of the present invention, may produce 350 free-standing single crystal silicon films, each having a thickness of 100 µm. As 1 m$^2$ represents about 45 tile surfaces with an area of 15 cm×15 cm, about 7.8 m$^2$ surface area of silicon can be produced from 70% of such a 5 cm thick ingot. In another embodiment, cleavage of about 70% of the length of such an ingot may produce 1750 free-standing single crystal silicon films having a thickness of 20 µm. In this embodiment about 39 m$^2$ of silicon can be produced from 70% of a 5 cm thick ingot. The remaining 30% of the ingot not cleaved to form single crystal silicon, can be returned to the melt as highly purified starting material to produce a fresh ingot for cleaving.

In a specific embodiment, the bulk material 110A can be a single crystal silicon ingot, a polysilicon cast wafer, tile, or substrate, a silicon germanium wafer, a germanium wafer, a substrate of group III/V materials, group II/VI materials, gallium nitride, silicon carbide or the like. In a specific embodiment, the bulk material can be a photosensitive material. The single-crystal silicon can be either from solar, semiconductor or metallic grade purity levels, depending upon tradeoffs sought between factors such as efficiency, cost, and post-processing such as impurity gettering.

Any of the single-crystal material can be cut to specific orientations that offer advantages such as ease of cleaving, preferred device operation or the like. For example, silicon solar cells can be cut to have predominantly (100), (110), or (111) surface orientation to yield free-standing substrates of this type. Of course, starting material having orientation faces which are intentionally mis-cut from the major crystal orientation can be also prepared. Of course there can be other variations, modifications, and alternatives.

Figure 2D:
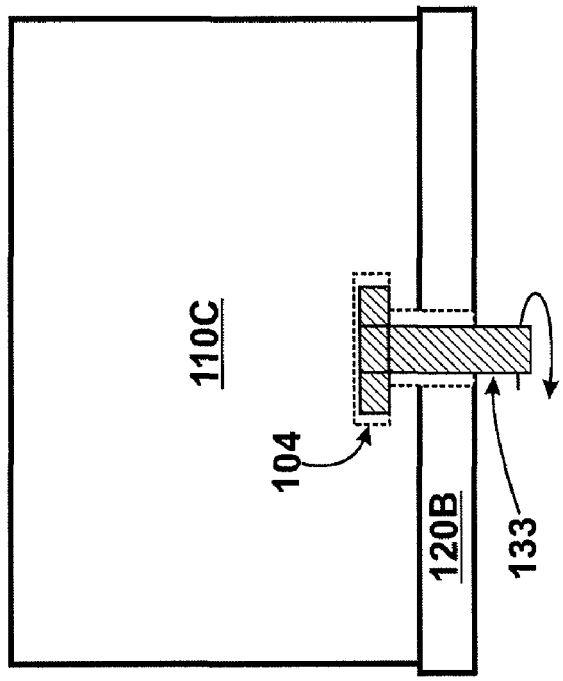
FIG. 2D shows a simplified cross section view of a bulk material being clamped by a mechanical clamp device via a lock structure at the bottom region according to another embodiment of the present invention.
Figure 2C:
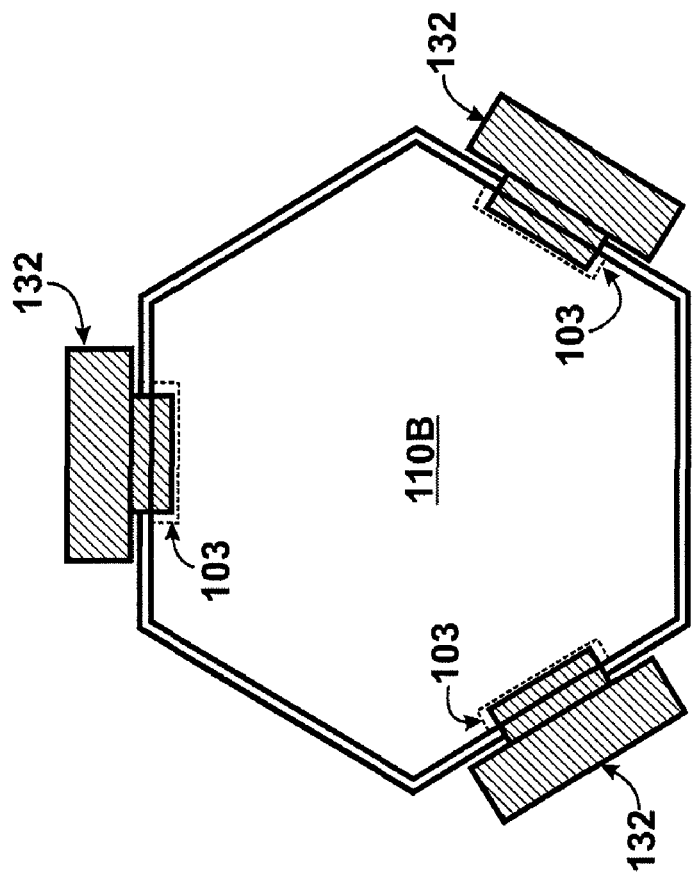
FIG. 2C shows a simplified top view of a bulk material with hexagon cross section shape being clamped by a mechanical clamp device according to another embodiment of the present invention.

In accordance with an embodiment of the present invention, the bulk material 110 may be prepared to have a plurality of cross sectional shapes based on the manufacture setup and material type. Accordingly, the clamping setup or mechanism can be varied or modified, provided that the surface region and majority of the side region of the bulk material can be processed without interference of the mechanical clamp device and the remaining bulk material can be released from the clamp device after certain cleaving process ends. For example, two arc shaped clamping arms located in opposite sides are shown in FIG. 2B for the circular cross section shape. In another embodiment, a single arc arm with longer length may be used for the removable clamping. In yet another embodiment, three or more arc arms with shorter length and alternative locations may be used for the removable clamping. FIG. 2C shows a simplified top view of a bulk material 110B with a hexagon cross section shape being removably clamped by three rectangular shaped clamping arms 132 adapted to the three notches 103 on the side region. FIG. 2D shows a simplified side view of a bulk material 110C being held on a stage 120B by a mechanical clamp device 133 via a lock structure 104 from the bottom region. The clamping arm 133 may be used as a key-like structure. The clamp arm 133 can be inserted into the lock structure built in the bottom region of the bulk material 110C, then rotated certain degree to a position to hold or lock the bulk material 110C securely. Of course there can be other variations, modifications, and alternatives.

Figure 2F:
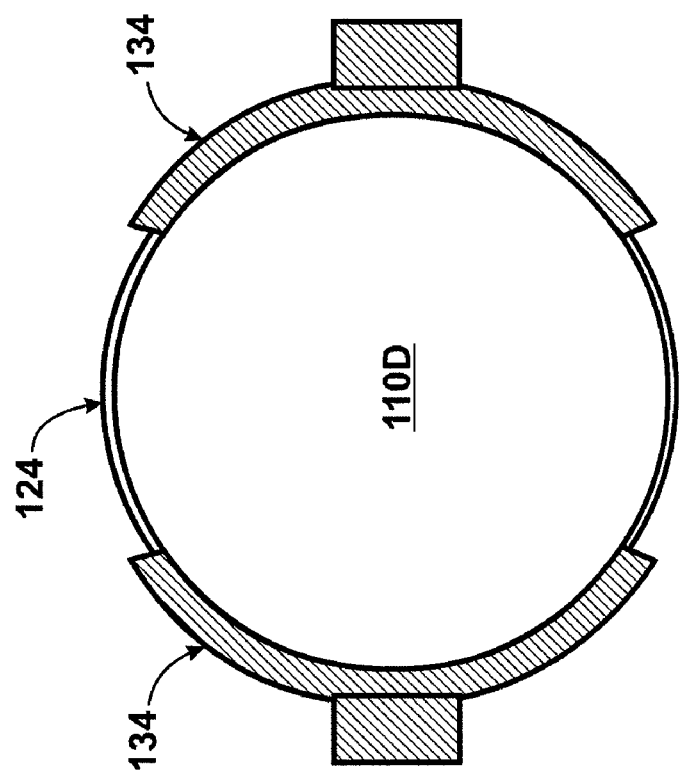
FIG. 2F shows a simplified top view of the bulk material of FIG. 2E being clamped by a mechanical clamp device direct at side region without a groove according to an embodiment of the present invention.
Figure 2E:
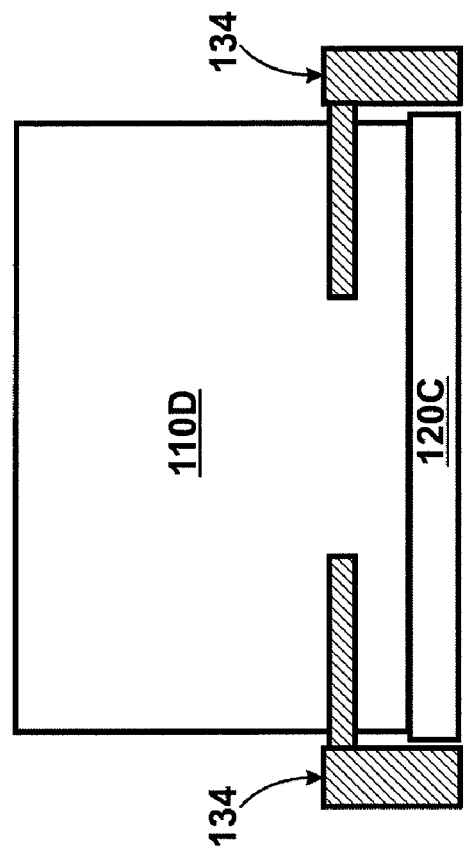
FIG. 2E shows a simplified cross section view of a bulk material being held on a stage by a mechanical clamp device direct at side region without a groove according to an embodiment of the present invention.

Still in accordance with an embodiment of the present invention, as shown in FIGS. 2E and 2F, the bulk material 110D such as silicon ingot in its natural form without any preprocessed grooves or notches can be clamped by two or more C-shaped mechanical clamp devices 134 and fixed on top of a stage 120C. The clamping positions are located near the lower half (for example, at less than 30% of the length measured from the bottom region) of the side region. In one embodiment, this clamping position allows that 100% of the surface region of the bulk material 110D is exposed and available for process without physical interference from the clamp device. Specifically, 100% utilization of the surface region for thick film cleaving out of the silicon ingot for photovoltaic device is one of advantages provided by the present invention. Additionally, in another embodiment, the clamping mechanism is aimed to allow the cleave process can be performed progressively to remove the thick films one by one from major portion of volume (for example, at least 70%) of the bulk material. In yet another embodiment, the clamping mechanism is using friction force to hold the bulk material 110D on the stage 120C. The thermal expansion coefficient for the mechanical clamp device may be bigger than that of the bulk material so that when the bulk material is processed at an elevated temperature or certain heat flux is passed through the clamp towards the bulk material the thermal expansion causes the clamping even tighter. In yet another embodiment, the clamp arms are adapted to match the shape of the bulk material to be clamped and have no sharp protrusion on surfaces so that the clamping engagement with the bulk material does not cause cracking on the side region due to strong clamping force applied.

Figure 3:
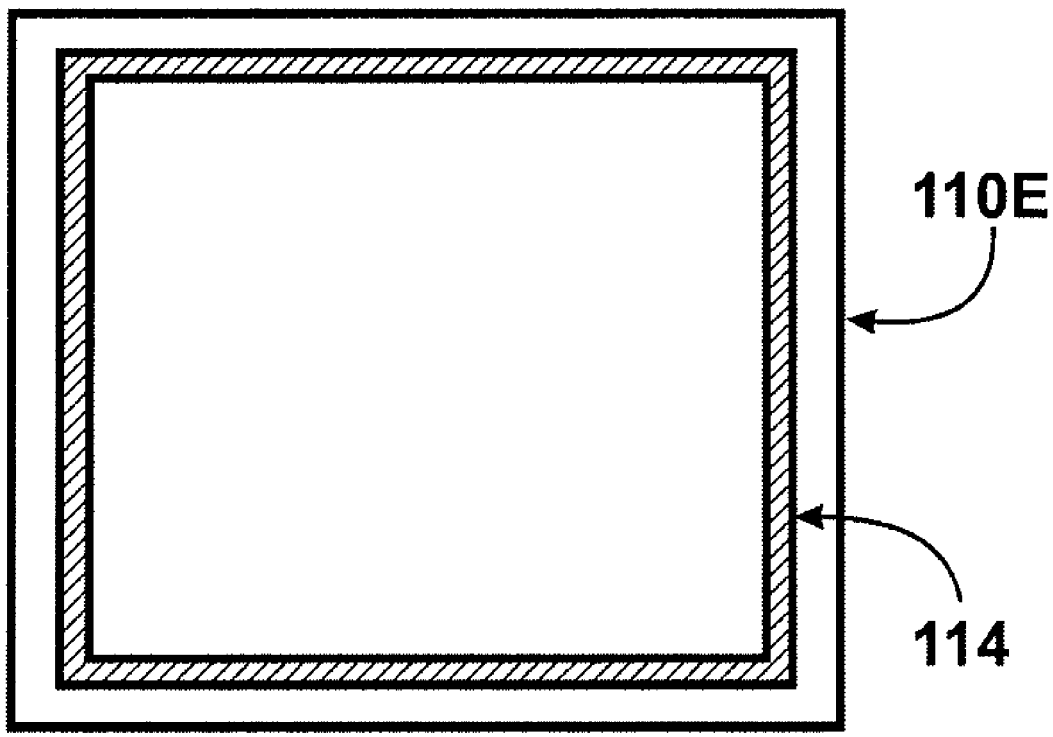
FIG. 3 shows a simplified view of the bottom region of a bulk material with a close-looped groove according to an embodiment of the present invention.

In accordance with an embodiment of the present invention, the bulk material may be pre-processed to have a planarized surface region where the implant process will start with and a smooth bottom region where the stage may engage with. As shown in FIG. 3, the bulk material may be additionally processed to have a close-looped groove 114 located in the smooth bottom region 118. As an example, the bulk material is assumed to have a square cross section shape. In one embodiment, the groove 114 is also in substantially square shape and located along the vicinity of the edge of the bottom region 118. In another embodiment, the groove 114 is capable of receiving a adapted gas-tight seal as the bottom region 118 of the bulk material 110E is engaged with the planar surface of the stage (assisted with the mechanical clamp device). The gas-tight seal and the two engaged planar surfaces between the bottom region of the bulk material 110E and the stage creates a cavity that can be filled with a layer of gas. The layer of gas, depending on the pressure, can greatly increase the thermal conductivity between the bottom region of the bulk and the stage. In yet another embodiment, once a certain gas-supply assembly is built in the stage this gas-assisted conduction effectively turns the stage, that is used to support the bulk material by engaging its bottom region, into a temperature controlled stage.

Figure 4:
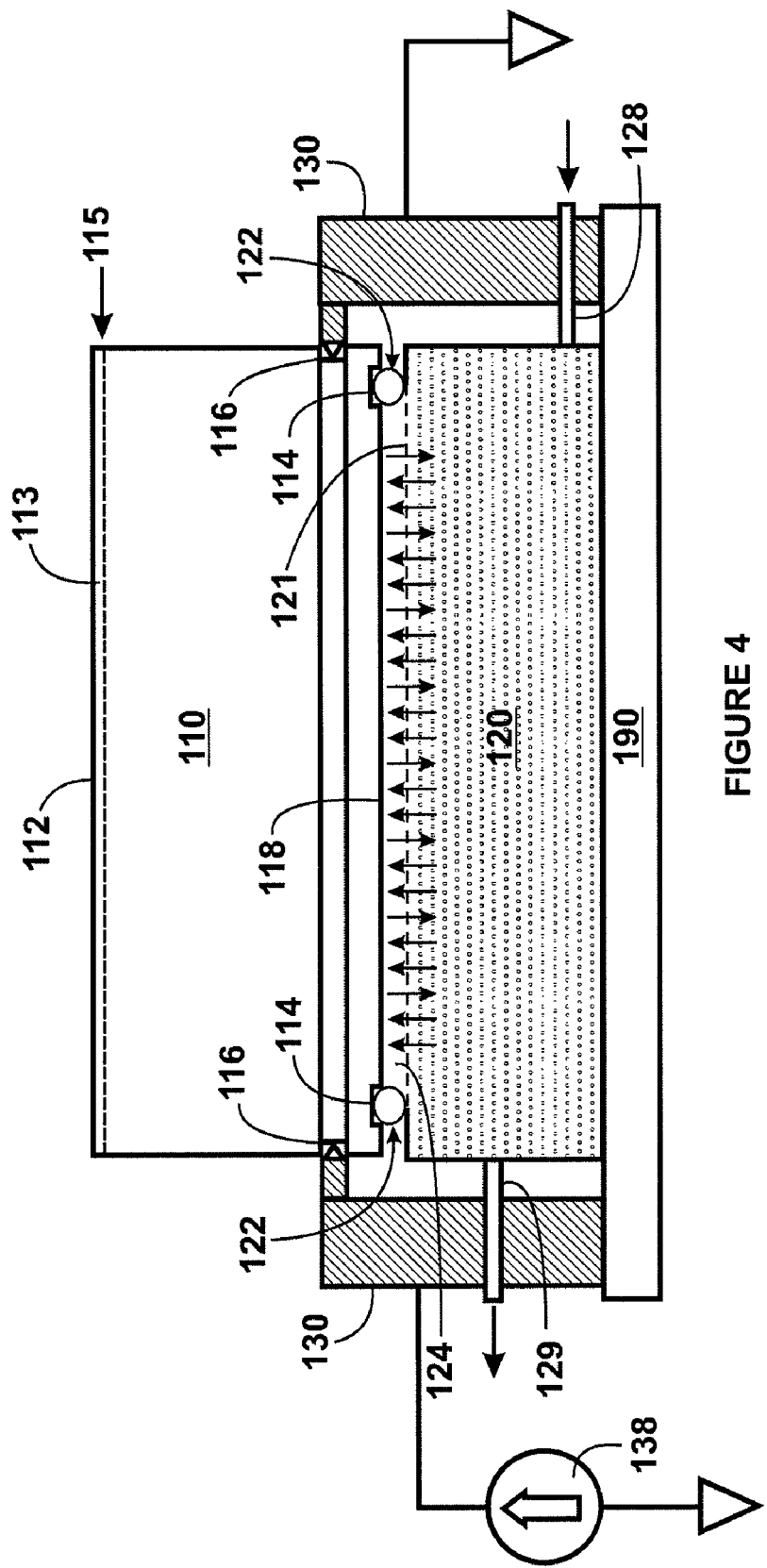
FIG. 4 shows a simplified cross section view of a bulk material being held by a clamp on a stage with a sealed cavity filled with gas between the bottom of the bulk material and the stage in accordance with an embodiment of the present invention.

FIG. 4 shows a simplified cross section view of a bulk material being clamped on a temperature controlled stage in accordance with an embodiment of the present invention. This figure is merely an example, which should not unduly limit the scope of the claims. One of ordinary skill in the art would recognize many variations, alternatives, and modifications. As shown in FIG. 4 the bulk material 110 is clamped with its bottom region 118 being held on to the surface 121 of the stage 120 with a gas-tight seal 122 inserted between the bottom region 118 and the surface 121 of the stage 120. The gas-tight seal 122 adapted to the first groove 114 in the bottom region 118 creates a cavity 124 with the bottom region 118 and the surface 121 of the stage 120 respectively as its top and bottom boundaries. The stage 120 further includes a plurality of gas passageways 126 on the surface 121 within the cavity 124 enclosed by the gas-tight seal 122. The plurality of gas passageways 126 are connected within the body of stage 120 through a gas supply assembly (not shown) having a gas inlet 128 and a gas outlet 129 so that a gas 127 with a certain pressure can fill in the cavity 124.

In one embodiment, the gas-tight seal 122 can securely maintain high pressure in the cavity 124 up to 20 Torr for a 6-inch silicon wafer or up to 300 Torr for a thick silicon ingot or tile with a weight of about 3 kg. Outside the cavity, the bulk material may be located in a vacuum system under a pressure around $5 \times 10^{-7}$ Torr. In one example, the gas-tight seal 122 may be an O-ring. In another example, the gas-tight seal 122 may be a flange made of dielectric material or metal material. The gas 127 may be a cryogenic gas or a room temperature gas or a heated gas. In one example, the gas 127 may be at least one gas of helium, hydrogen, argon, or nitrogen.

In one embodiment, a mechanical clamp device 130 adapted to the second groove 116 in the side region of the bulk material is applied to clamp the bulk material 110 on the surface 121 of the stage 120. In another embodiment, the clamp device 130 may comprise a metal body with designed strength to securely hold the bulk material with certain weight plus the upward force due a pressure difference between the surface region with a vacuum environment and the bottom region under the backpressure within the cavity. For example, a 200 Torr cooling gas backpressure in the cavity 124 used while the bulk material in undergoing implantation within a vacuum environment would produce about 135 lbs of force. Clamp device 130 would therefore have to hold the bulk material against such upward forces.

In certain embodiment, the stage 120 is a electrostatic chuck containing a dielectric body embedded with a metal plate electrode. By applying a voltage between the metal plate electrode and the bulk material 110, an electrostatic force may be generated to attract the bulk material 110 on the stage 120. In one embodiment, when smaller backpressures up to about 25 Torr is gauged in the cavity 124, the mechanical clamp device 130 may be eliminated and replaced if such an electrostatic chuck is used. Alternatively, both the clamp device 130 and a stage with electrostatic chucking can be used. Additionally, both the mechanical clamp device 130 and the stage 120 are mounted on a tray base 190. The tray base itself is capable of moving two-dimensionally in a X-Y plane that is parallel to the planar surface 121. Of course there can be other variations, modifications, and alternatives.

In another embodiment, the clamp device 130 can also be used as an electric contact means to add IR heating to the bulk material 110 according to an embodiment of the invention. An electric source 138 develops a joule heating due to a current I passing the bulk material. The heating level is equal to $I^2R$ where R is the resistance of the material based on its resistivity, material dimensions and contact geometry.

Adjustment of the pressure of the gas 127, through the gas supply assembly (not shown) built in the stage 120, can result in temperature control in the apparatus 100. Gas molecules bounce between the bottom region 118 and the planar surface 121 of the stage, transferring energy between the surfaces. For certain bulk material, stage dielectric material, and gas type, a gas surface accommodation coefficient is about fixed. For a fixed height of cavity 124 the higher the gas pressure the higher the thermal conductivity or better energy transfer between surfaces 118 and 121. For a cavity height less than 10 microns, the gas mean free path typically still may be larger than the cavity height even with the high gas pressure, for example 200 Torr. Therefore, on average the gas molecules may travel between the surfaces 118 and 121 without collision so that energy is not returned to the surface that it came from, making the most efficient heat transfer between surfaces 118 and 121. When the gas pressure is reduced with a controlled rate, the heat transfer is lowered under control and further the temperature at the surface region 112 can be changed with control.

Adjustment of the temperature of the gas supplied further can result in the temperature control. In one example, the gas 127 can be pre-cooled to cryogenic temperature for accelerated cooling, providing a downward heat transfer 148 from the surface region to the bottom region of the bulk material. Alternatively, the gas 127 can be pre-heated to either slow down the cooling or even form an upward heating flux 148 towards the surface region from the stage. Essentially, the stage 120 including the gas-layer interface region can be used as a steady state temperature control device with CW power flux control for the bulk material. The temperature control can be provided during an implanting process and/or other like process.

In another embodiment, the gas-assisted conduction is limited by a surface accommodation coefficient that depends on the physical properties of bottom region of the bulk material and the stage surface. The surface accommodation coefficient is 1 when the gas molecules have complete randomizing speed within the cavity, and when molecules bounce off elastically without energy transfer between the boundaries of the cavity. In one example, a typical value of this coefficient is about 0.3 for silicon surface and a stage surface made of dielectric material.

The desired thermal conductivity is depended on the heat capacity or thermal mass of the bulk material that is being handled. With a relatively heavy bulk material and a thin cavity height between the stage and the bottom region of the bulk material, high pressure of a light gas such as He or $H_2$ could be best choice for achieving high thermal conductivity. Additionally, adjusting the gas pressure could be a very effective way to control the heat transfer between two solid surfaces. For example, for a silicon ingot about 5 cm thick, a thermal conductivity up to $4 \times 10^4$ $Wm^{-2}K^{-1}$ may be achieved using a thin cavity of a few microns in height and a gas pressure up to 300 Torr. This high thermal conductivity achieved with a relatively high backpressure can only be maintained if the bulk material is of sufficient mechanical rigidity against potential upward bending. For the 5 cm thick ingot materials described in some embodiments (and even after thinning to a final thickness of 1.5 cm after repeated film detachments), this requirement is met.

In the above examples, the bottom of the bulk material could also be coupled to the temperature controlled face through an adapter plate to which it is permanently or temporarily fixed. As described in more detail below, the adapter plate would allow the mechanical and thermal coupling from the bulk to the heat transfer plate. Of course, there can be other variations, modifications, and alternatives.

Referring back to FIG. 1, another component of the apparatus 100 is the implant device 140. The implant device 140 may be an independently operated linear accelerator that is capable of producing ionic particles with high energy, for example 2 MeV or higher. The linear accelerator may include but is not limited to a plurality of radio frequency quadrupole (RFQ) elements and/or a plurality of drift tube linear accelerator (DTL) units and/or the combination of both. These elements may extract an ion beam from a microwave ECR ion source then confine and accelerate the ions to a final desired energy level. The ionic species may comprise hydrogen, deuterium, or helium species. The particle beam current can be up to 20 mA and beam size can expanded to nearly 50 cm by a beam expander (not shown) mounted at the exit aperture of the implant device 140.

Of course, one of skilled in the art would recognize many alternatives, variations, and modifications of the configuration of the implant device. For example, such implant device has been made recently available by the use of radio-frequency quadrupole linear accelerator (RFQ-Linac) or Drift-Tube Linac (DTL) available from companies such as Accsys Technology Inc. of Pleasanton, Calif., or RF-Focused Interdigitated (RFI) technology from Linac Systems, LLC of Albuquerque, N. Mex. 87109, and others.

Referred again to the FIG. 1, apparatus 100 utilizes the implant device 140 to introduce a beam of ionic particles in MeV level to the surface region 112 of the bulk material 110. This implantation of ionic particles into the bulk material, in accordance with embodiments of the present invention, may enable a cleaving process to form free-standing films. The energies depend, in part, upon the implantation species and conditions. Effectively for certain energy level of the particle beam, the particles can reach down to a certain end-of-range (EOR) depth beneath the surface region 112 and add stress or reduce fracture energy along a plane at about the EOR depth. These particles reduce a fracture energy level of the bulk material around EOR depth to form a cleave region 115 or cleave plane. This allows for a controlled cleave along the formed cleave region to remove the overlaid film 113 from the bulk material 110.

In accordance with embodiments of the present invention, ion implantation can occur under conditions such that the energy state of the bulk material at all internal locations is insufficient to initiate a non-reversible fracture (i.e., separation or cleaving) in the bulk material. It should be noted, however, that implantation does generally cause a certain amount of defects (e.g., micro-detects) in the bulk material that can typically be at least partially repaired by subsequent heat treatment, e.g., thermal annealing or rapid thermal annealing.

An associated result of the ion implantation may be a temperature increase of the bulk material around the surface region and beneath due to the power flux 145 of impinging ion particles. The output beam from the implant device 140 in apparatus 100 may be on the order of a few millimeters in diameter. The implantation application may require the beam diameter to be expanded to the order of a few hundred millimeters or more in order to keep the power flux impinging on the target surface from becoming too large and possibly overheating or damaging the target surface. For a particular particle beam profile (with certain beam current and beam size), the temperature rise due to the particle power flux 145 could be also limited by setting a proper duty factor (e.g., 0% is off, 50% is half power, and 100% is full power) for the implant device 140. In another embodiment, the moving tray 170 allows the beam to scan with a certain rate across the surface region 112 so that the ion beam heating by the flux 145 is time-averaged. Alternatively, beam scanning alone or in conjunction with movement of the tray, would allow the beam to be moved across the surface of the target surface and also allow time-averaging of the beam flux.

Both the ion implantation and the associated temperature rise may be rate limited thermal processes that can be utilized for the temperature control during the implant and in-situ implant annealing processes. For example, the apparatus 100 described earlier may be able to control the ion implantation results in terms of both the dosage and the substrate temperature rise, to achieve a desired cleaving plane appropriate for removing free-standing films from the bulk material.

Referring again to FIG. 1, the apparatus 100 uses a sensor device 150 to collect data related to current conditions about the bulk material. Particularly, the sensor device 150 uses a plurality of sensors to measure or monitor surface properties of the bulk material 110, including at least the temperature values at both the surface region 112 and the bottom region 118 as well as the surface roughness of the surface region 112. The measurement and monitoring may be continuous and dynamic during the implant process. The sensor device 150 may be capable of dynamically generating a set of input data for any particular process time point.

The sensor device 150 may include at least five different types of sensors. A first type are temperature sensors, which may be placed near the surface region 112 and bottom region 118, and are capable of measuring the temperatures at the surface region and the bottom region of the bulk material 110. Temperature sensors may be used as direct input data for the controller 160 to execute programmed temperature control routines. Additional temperature sensors may be placed at the gas inlet 128 to measure the temperature of supplied gas 127. More temperature sensors may be needed for measuring temperature at the second groove 116 to provide input for thermal or electrical conduction through the clamp device 130. In one example, the temperature sensors can include contact type such as thermocouples. In another example, non-contact type temperature sensors such as optical pyrometers may be used.

A second type of sensor is the pressure sensor, which may be placed within the cavity 124 near the bottom region 118 to measure the pressure of supplied gas 127 therein. The pressure sensor may sense the pressure of supplied gas that guides the temperature change of the bottom region 118 using gas-assisted conduction. Such a pressure sensor, for example a pressure gauge, should be operable for a wide pressure range or multiple gauges can be used to achieve the desired pressure measurement range.

The third type of sensor may be capable of tracking the weight of the bulk material 110 after each thick film has been detached by the cleaving processes. The weight of the bulk material corresponds to a specific heat capacity and thermal resistance, which in turn determines a thermal time constant useful for optimizing the temperature control using the temperature controlled stage 120. Alternative or in conjunction with a weight sensor, a position sensor or "tile-counter" may be used, which monitors the surface level change or the current length 111 of the bulk material, measured from a current surface region 112 to the bottom region 118, after each progressive cleaving processes.

A fourth type of sensor is the surface roughness or defect inspection sensor that provides information of the surface condition after each cleaving process. Based on this input data the apparatus 100 is able to determine whether the ingot or tile surface needs to be relapped, polished or repaired. In an embodiment, this type of sensor may be able to measure planarity differences or particle spikes that were caused by certain cleave failures. This information allows the apparatus 100 to self-diagnose its ability to continue in full production and ensures the general quality of the resulting free-standing thick films.

A fifth type of sensor may include an acoustic or optical sensor to capture pre-cleave information of the treatment zone so that how the cleaving power flux is inducing the onset of microcracks propagating along the cleave plane, can be monitored. Additionally, the acoustic emission detected by the sensor, which is transient elastic waves within a material due to localized stress release, can be used to throttle the laser pulse energies up or down during the cleaving process. Such an acoustic sensor works in the ultrasonic regime, typically within the range between 100 kHz and 1 MHz, but may be down to 1 kHz or up to 100 MHz. Typical acoustic sensor includes a transducer based on electric, electronic, electromechanical, or electromagnetic mechanisms. Alternatively, use of an optical sensor would sense optical changes in the cleave plane prior or during cleaving to control the onset and propagation of the cleave process according to a specific embodiment. Depending upon the embodiment, sensing can occur using combinations of any of these techniques and others.

Referring again to FIG. 1, the apparatus 100 further includes an controller 160 which can be configured to receive and process the input data generated by the sensor device 150. The controller 160 also couples to and commands the implant device 140 and the temperature controlled stage 120 to dynamically control the temperature of the bulk material 110 during the progressive implant processes useful to produce a plurality of free-standing thick films. In one embodiment, the controller 160 is configured to execute a dynamic feedback/feedforward control scheme to determine the best operation routine. In this control scheme an input data related to current conditions of the bulk material including surface temperature, bottom temperature, bulk material weight (or length), surface roughness, and etc. is processed. Based on a pre-determined recipe for implantation, in-situ annealing, and/or subsequent cleaving at any specific time point, the controller calculates an optimized control routine as an output wherein the operation instructions are given to adjust duty factor of the implant device 140 and/or to change the bottom temperature using the stage 120 by adjusting the backpressure and temperature of the supplied gas 127 in the cavity 124.

Additionally, in one example, the controller 160 may be also coupled to one or more external floodlight heating source 141 above the surface region to provide extra CW power flux 146 towards the treatment zone of the bulk material under processing. In another example, one or more pulsed thermal sources 142 located above the surface region may be further applied to supply power flux 147 for annealing or increase surface temperature with rapid ramping rate. In one embodiment, the pulsed thermal sources 142 can help develop an efficient cleave region 115 through the introduction of an energy pulse 149 locally within a thermal time constant of the treatment zone, roughly 50 microseconds for a 100 μm thick free-standing film production process. One example of a pulsed thermal source is a YAG laser pulse system delivering about 0.1-50 joules of energy per $cm^2$ with a characteristic pulse width of a few nanoseconds to tens of nanoseconds or more. The fundamental 1.06 μm YAG line would deposit most of the laser thermal energy within 100 μm required for this application. The cleave region is expected to efficiently absorb the residual infrared (IR) radiation reaching there for that the local EOR damage increases the silicon IR absorption coefficient. The instantaneous temperature difference across the lower thermal conductivity EOR region produces a shear stress that can further reduce cleave energies or even initiate cleave processes.

As another example, if the laser light is to be mostly absorbed within the EOR damage in the cleave region (where the light can impinge onto the cleave region along all angles from the peripheral side region of the bulk material), the laser pulse energy will generate a high level of stress after irradiation until thermal relaxation to the surrounding material. The relaxation time constant of the cleave region will be on the order of 25 nanoseconds to 20 microseconds or more depending on the implant energy (which determines the cleave region thickness) and the effective thermal conductivity of the cleave region. In accordance with certain embodiments of this invention, heating of the surface region includes heating of either the EOR cleave region, the overlying film to be cleaved, or both.

In yet another example, extra cooling may be contributed by attaching a water cooling system (not shown) at the bottom of the stage 120 and by attaching independent heat sink to the mechanical clamps 130 to enhance conduction. More descriptions of a method of temperature control during the cleaving processes for removing free-standing thick films from bulk material will be seen in the specification below.

Figure 5:
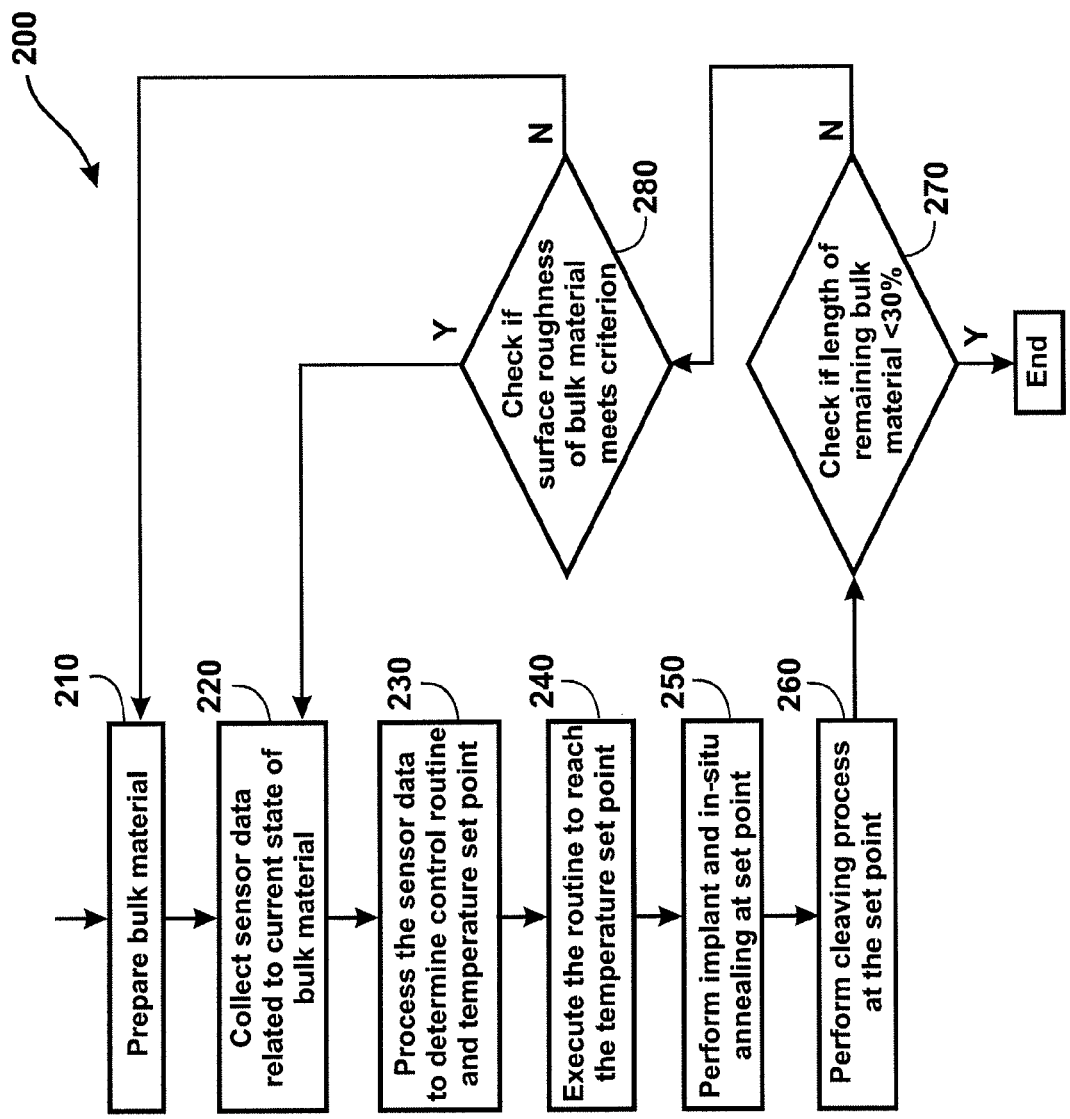
FIG. 5 shows a simplified flow chart illustrating a method of temperature control during implantation and cleaving process according to an embodiment of the present invention.

FIG. 5 shows a simplified flow chart illustrating a method of temperature control during cleaving processes for progressively removing free-standing films from a bulk material according to an embodiment of the present invention. This figure is merely an example, which should not unduly limit the scope of the claims. One of ordinary skill in the art would recognize many variations, alternatives, and modifications. The method 200 includes the following processes:

1. Process 210 for preparing a bulk material;
2. Process 220 for collecting sensor data related to current state of the bulk material;
3. Process 230 for processing sensor data to determine control routine and temperature set point;
4. Process 240 for executing control routine to reach the set point;
5. Process 250 for performing implant and in-situ annealing processes at the set point;
6. Process 260 for performing cleaving processes (if within system 100);
7. Process 270 for checking length of remaining bulk material, if less than 30% end process; if not, proceed to next process; and
8. Process 280 for checking surface roughness of bulk material; if meets criterion set back to process 220 and onwards; otherwise, set back to process 210 and onwards.

The above sequence of processes provides a method according to an embodiment of the present invention. Other alternatives can also be provided where processes are added, one or more processes are removed, or one or more processes are provided in a different sequence without departing from the scope of the claims herein. Further details of the present invention can be found throughout the present specification and more particularly below.

Referring to the FIG. 5, the method 200 first includes a process step 210 to preparing bulk material for cleaving to produce free-standing film. In accordance with certain embodiments, the bulk material may comprise a semiconductor material such as single crystal silicon, present as grown in the form of a bulk ingot. In another embodiment, the bulk material may be a large tile of polycrystalline silicon. In a specific embodiment, the ingot materials and/or polycrystalline tiles may have a pre-processed body with a length and a substantially circular or polygonal cross-section shape. The length of the bulk materials can be predetermined to facilitate temperature controlled cleaving. For a bulk material with uniform density, the length is equivalent to its weight. For example, for crystalline silicon ingot, preferred length is about 5 cm with a weight about 3 kg.

In another specific embodiment, preparing the bulk material for cleaving includes using a variety of planarization processes to smoothen both the surface region for producing quality device-ready films and the bottom region for holding onto a stage. In yet another specific embodiment, preparing the bulk material includes using a modified high dose energetic ionic particle implant process, for example the high energy particles generated by the implant device 140 in the apparatus 100, to collapse the surface roughness to a lower level. In certain embodiments, preparing the bulk material also includes lightly etching the surface and/or depositing a thin smooth layer to reduce the surface roughness. In certain other embodiments, preparing the bulk material further includes incorporating the device manufacture processes to deposit coatings/films such as optical coupling layers, transparent conductive oxides, and light trapping layers on the surface region before the cleaving process. For subsequent cleaving, the surface conditions will be rechecked each time a film is removed from the bulk material to determine if the surface needs treatment that may lead to different options for next process step.

The first process step 210 of the method 200 to prepare the bulk materials further includes making a first groove on the bottom region of the bulk material. In a specific embodiment, the first groove can be a close-looped one which is located near the edge of the polygonal bottom. The first groove is designed to fit a gas-tight seal for creating an gas-layer interface when the smoothened bottom region of the bulk material is engaged with the planar surface of the stage. Additionally in one embodiment, the process 210 further includes making a second groove on the peripheral side region of the bulk material at a pre-determined position. The position of the second groove typically may be set below 30% of the length of the bulk material measured from the bottom so that, at the next step, a mechanical clamp device adapted to the groove can properly clamp the bulk material from the side region without interfering the implant or cleaving process progressively performed up to 70% of the bulk material from the surface region. In one example, the second groove may be a single groove surrounding the peripheral side. In another example, there may be a group of grooves located at various positions around the bulk material. In another embodiment, the process 210 may include making a lock structure at the bottom region for, at the next step, a mechanical clamp device having a key structure to securely lock the bulk material on the stage from the bottom.

The first process step 210 of the method 200 to prepare the bulk materials further includes clamping the bulk material by a mechanical clamp device using the second groove as a clamp groove. In an alternative embodiment, the bulk material 110 can be securely held by the mechanical clamp device from the bottom region via a lock structure. In a specific embodiment, as shown in FIG. 4, the bulk material 110 is clamped by a mechanical clamp device 130 and is held on the stage 120 with the bottom region 118 coupled to the planar surface 121 of the stage separated only by a gas-tight seal 122. The gas-tight seal 122 is configured to match the first groove 114 to connect the bottom region 118 and the stage surface 121 and at the same time create a thin cavity 124 between them, with the bottom region 118 of the bulk material and the planar surface 121 of the stage being the top and bottom boundaries respectively. The gas-tight seal 122 is secure enough, assisted with the mechanical clamp device, to hold a high-pressure difference inside/out the thin cavity 124 formed thereof. In a specific embodiment, the planar surface 121 of the stage 120 contains a plurality of gas passageways 126 to allow a gas 127 filled in the cavity 124 with an adjustable pressure. The gas typically is hydrogen or helium gas supplied with an assembly built inside the stage 120 with an inlet 128 and an outlet 129. The gas 127 can be at cryogenic or room temperature. Alternatively the gas can be heated.

Referring back to FIG. 5, once the bulk material is prepared and held onto the stage surface, the process step 220 of the method is performed. In this step, the data related to the current state of the bulk materials are collected by one or more sensors operated by a sensor device. For example, the sensor device is shown in FIG. 1 as sensor device 150.

In one embodiment, the one or more sensors operated by the sensor device include temperature sensors for measuring temperature at the surface region, $T_s$, and the temperature at the bottom region, $T_b$. In another embodiment, the one or more sensors also include a position sensor to track the bulk material history during the cleaving processes by detecting the surface region position of the bulk material which in turn provides the current length or weight information of the bulk material. In yet another embodiment, the one or more sensors include a pressure sensor to indicate the pressure within the cavity between the bulk material bottom region and the stage surface. Collecting the sensor data or performing certain measurements are carried at any given time point once the bulk material is prepared at process 210 and till the final cleaving process is over (except certain cleaving process criterion is not met that stop the process flow). The collected sensor data can be sent and processed by a linked controller. For example, the controller 160 is included within the apparatus 100 as shown in FIG. 1.

The process step 230 of the method 200 is to use the controller to process these sensor data as an input of a temperature feedback/feedforward control scheme to change the surface temperature of the bulk material to a desired process (implantation and/or cleaving) temperature based on a process recipe. At any specific time point, the recipe determines a set point for the desired process temperature, $T_p$, of the bulk material at the surface region, more specifically within the treatment zone. Then the input data from the sensors data at the time point will be received and processed by the controller in the feedback/feedforward control scheme to determine a best routine to change the current temperature at the surface region, $T_s$, to the target set point, $T_p$, and/or maintain at that temperature as desired. The control routine is programmed to keep the control loop stable to achieve the fastest or at least predetermined heat/cool rates to reach to the process temperature in the most efficient manner.

Figure 6:
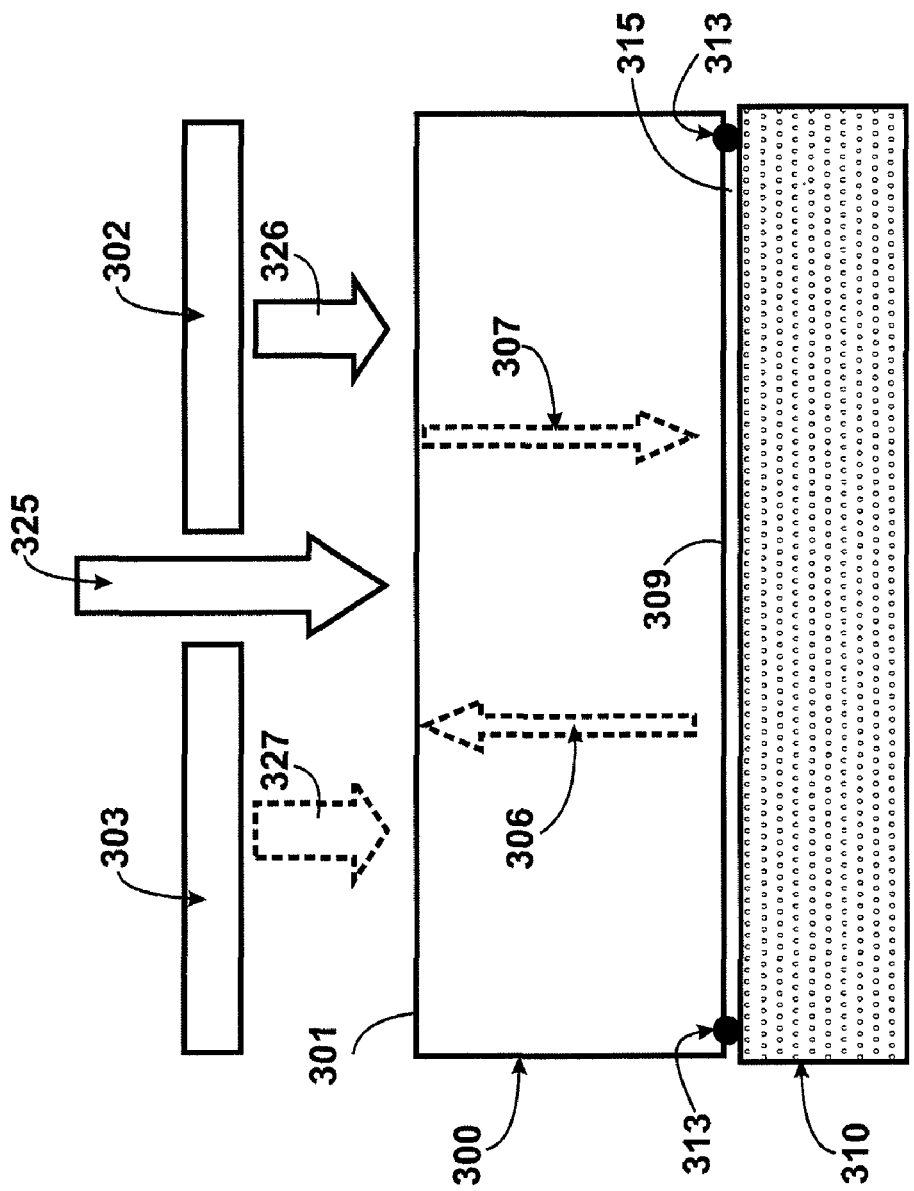
FIG. 6-11 are simplified diagrams illustrating a method of cleaving a free-standing film from a bulk material under temperature control according to an embodiment of the present invention.

The process step 240 of the method 200 is then performed to execute the selected control routine to reach the set point from a given time point. In an embodiment, the control routine to change temperature includes both heating and cooling operations utilizing multiple radiation, convection, and conduction heat transfer paths. For example, heating is required if the current temperature $T_s$ is below the set point $T_p$. In a specific embodiment, as shown in the simplified diagram of FIG. 6, one or more external radiant sources 302 such as floodlights can be used to heat the surface region 301 of the bulk material 300 from above with a CW power flux 326. The controller may be linked to these external radiant sources through a feedback loop to control the lamp current, on/off frequency, and spatial contribution to heat the surface with desired ramp rate and uniformity. External radiant sources may also include pulsed thermal sources 303 such laser pulsing sources for annealing and cleave region enhancement through pulsed power flux 327.

In another embodiment, part of the cleaving process involves an ion implantation process utilizing high energy particles generated by an implant device. Power flux 305 of the high-energy particles bombarded on the surface region 301 tend to heat up the latter. The controller may be linked to the implant device, for example the implant device 140 in the apparatus 100, to control the duty factor, on/off frequency of the operation as well as the beam size and scanning speed of the particle beam to control the heating during implantation.

In yet another embodiment, heat flow 306 can also come from the bottom region 309 to the surface region 301 by thermal conduction. The supporting stage 310 may be used to drive or control the heat transfer by changing the bottom temperature. In one example, the heat may be supplied through this path for a post ion implantation annealing process at certain elevated surface temperature.

In yet another embodiment, heat flow 306 can also come from Joule heating, inductive heating or the like. One example is $I^2R$ heating of the bulk material by passing an electric current through the bulk material. In one example, the heat may be supplied through this path for a post ion implantation annealing process at certain elevated surface temperature.

In another specific embodiment of the present invention, the stage may be used predominantly for cooling by lowering the bottom temperature so that the heating of surface region during the implantation or cleaving process can be compensated. In other words, through the same path as shown in the simplified diagram of FIG. 6, heat flow 307 is now flowing from the surface region 301 to the bottom region 309. To efficiently lower the bottom temperature $T_b$, a cryogenic gas may be supplied into the cavity 315 between the bottom region and the cooled stage surface 311 enclosed by the gas-tight seal 313. With a pressure as high as 300 Torr in the thin cavity (e.g., of a few microns) the fast moving gas molecules collide with the two surfaces can efficiently transfer thermal energy from the bottom region 309 to the cold stage surface 311. By adjusting the gas pressure, the gas molecules mean free path can be changed relative to the cavity height to optimize the heat transfer.

In most cases, due to large thermal mass of the bulk material the cooling control time constant by conduction through the stage is slower than the heating by radiant source or particle bombardment on the surface region since the EOR region will develop a progressively lower thermal conductivity upon implant and certain cleave plane formation anneals and thus this layer will be more susceptible to surface heating. As the cleaving process continues progressively, the bulk material length is reduced and so does its cooling time constant. By utilizing the position sensor data that tracks the changing length, the controller would be able to update the time constant and adjust other control paths if necessary. Thus an updated optimum control routine for the upcoming cleaving process can be generated.

In one embodiment, as the bulk material is thinning, the gas pressure within the cavity may be lowered to reduce the thermal conductivity to slow down the cooling. In another embodiment, the control scheme is design to accommodate all the rate processes to keep the control loop stable and to achieve the fastest or at least pre-determined heat/cool rates to get the desired process temperature in a most efficient manner. For example, prior to implant, if the target bulk material is cold but the recipe calls for 300° C., a hotter than 300° C. setting may be used to allow the implant bulk material to reach the 300° C. at the surface faster with the stage reducing the temperature earlier than the point being reached, overdriving the temperature to keep heat/cool cycles as fast as possible.

Figure 7:
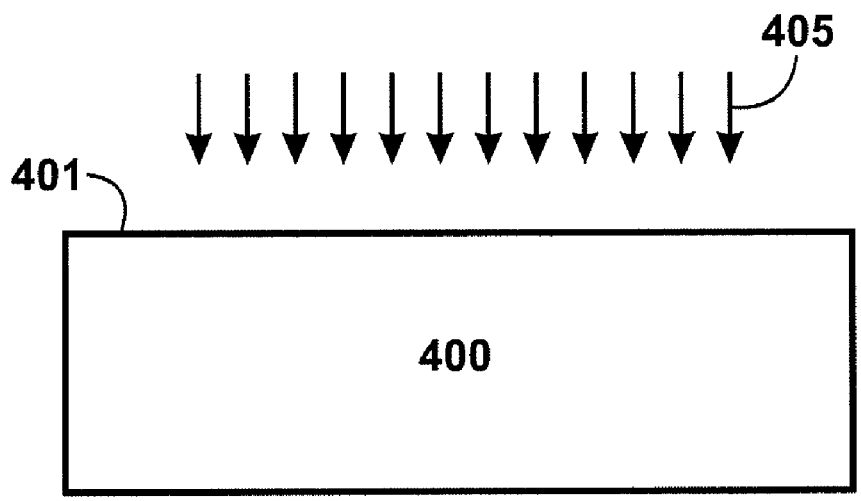

Referring back to FIG. 5, once the surface temperature $T_s$ is reached to the set process temperature $T_p$, the process step 250 of the method 200 is performed to start the implant process. In accordance with particular embodiments of this present invention, as shown in the simplified diagram of FIG. 7, the process 250 includes subjecting the surface region 401 of the bulk material 400 to a first plurality of high-energy particles 405. In accordance with particular embodiments, high energy particles 405 can be generated using the implant device which may include a linear accelerator. In-situ anneals that incorporate a sub-process of set point temperature treatments between implant sub-steps and post implant anneals can also be made. As with all other steps in FIG. 5, the steps 220 and 230 can be re-applied numerous times within the succeeding steps 250 and 260. FIG. 5 is therefore just an example of a first set point process and not to be regarded as limiting. Of course there can be other variations, modifications, and alternatives.

Figure 8:
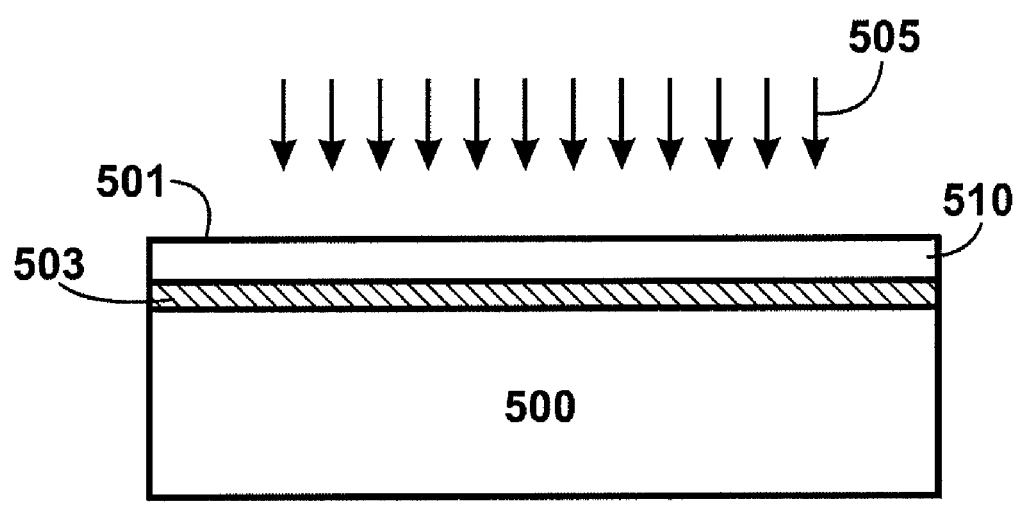

In a specific embodiment, as shown in the simplified diagram of FIG. 8, the resulting implantation of the high energy particles 505 causes formation of a plurality of gettering sites or an accumulation region within a cleave region 503. This cleave region 503 may be provided beneath the surface region 501 to define a thickness 510 of the bulk material 500 that is to be detached as a free-standing layer. Preferably, the first plurality of high-energy particles provide an implant particle profile having a peak concentration and a base spatially disposed within a depth of the bulk material. Of course there can be other variations, modifications, and alternatives.

In one embodiment, the cleave region is maintained at a first temperature during the implantation, for example in a range between about −100° C. and 250° C., which can be provided directly or indirectly. In one embodiment, the temperature can be controlled by the apparatus 100. In another embodiment, the temperature may be controlled by performing process steps 220, 230, and 240. Of course there can be other variations, modifications, and alternatives.

Depending upon the application, according to particular embodiments, smaller mass particles are generally selected to decrease the energy requirement for implantation to a desired depth in a material and to reduce a possibility of damage to the material region. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. Alternatively, the particles can be any combination of the above particles, and or ions and or molecular species and or atomic species. The particles can be derived from compounds such as gases, e.g., hydrogen gas, water vapor, methane, and hydrogen compounds, and other light atomic mass particles. The particles generally have sufficient kinetic energy to penetrate through the surface to the selected depth underneath the surface.

For example, using hydrogen as the implanted species, the implantation process is performed using a specific set of conditions. Doses of implanted hydrogen can ranges from about $1\times10^{15}$ to about $1\times10^{16}$ atoms/cm$^2$, and preferably the dose of implanted hydrogen is less than about $8\times10^{16}$ atoms/cm$^2$. The energy of hydrogen implantation can range from about 0.5 MeV to about 5 MeV and greater, for the formation of thick films useful for photovoltaic applications. Implantation temperature ranges from about −100 C.° to about 250° C., and is preferably less than about 400° C. to avoid a possibility of hydrogen ions diffusing out of the implanted silicon cleave region. The hydrogen ions can be selectively introduced into the silicon wafer to the selected depth at an accuracy of about ±0.03 to ±3 microns. Of course, the type of ion used and process conditions depend upon the application.

In a specific embodiment, a silicon film thickness ranges from about 15 μm to about 200 μm may be formed using a proton implant having an energy range of about 1 MeV to about 5 MeV. This thickness range allows the detachment of a thickness of a single-crystal silicon that can be used as a free-standing silicon layer. Free-standing silicon layers having a thickness range of 15-200 μm according to embodiments of the present invention may be used to replace conventional wafer sawing, etching, or polishing processes. Thus where a conventional separation technique would be expected to result in a kerf loss of about 50% (kerf loss as being defined as the material lost during the cutting and wafering operations), techniques in accordance with embodiments of the present invention result in virtually no kerf losses, resulting in substantial cost savings and improvements in the efficiency of material utilization.

In accordance with certain embodiments, implantation energies higher than 5 MeV may be used. Such high energies of implantation may be useful to fabricate free-standing layers as substrates of alternative materials in the fabrication of semiconductor devices. In the manufacture of solar cells, however, a free-standing material thickness of 200 μm or less is generally desired.

Figure 9:
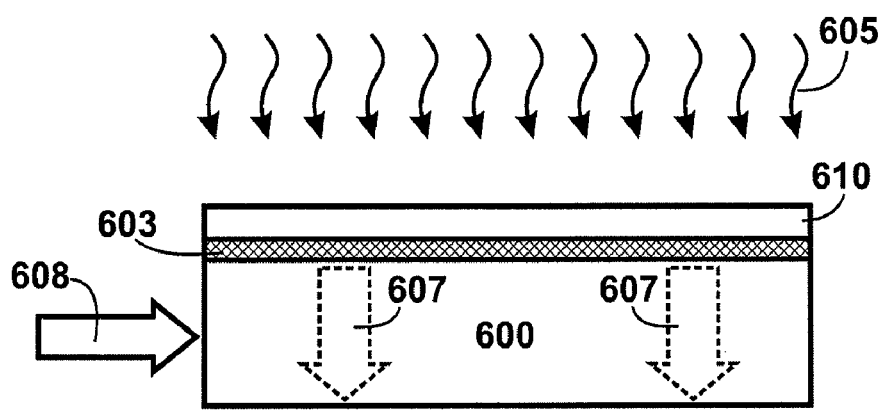
Figure 10:
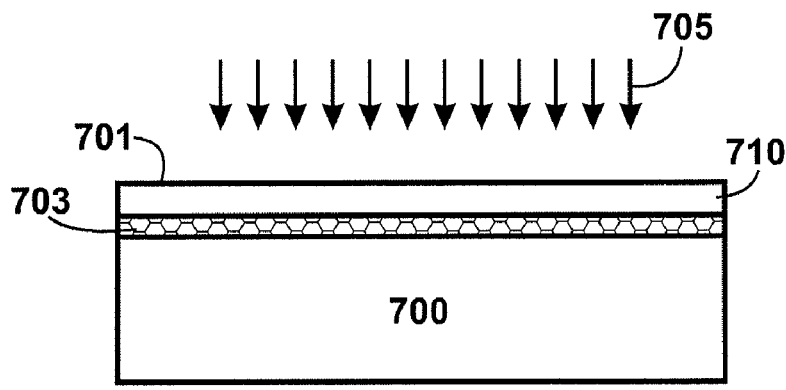

Referring now to FIG. 9, embodiments of the method 200 in accordance with the present invention may optionally perform a thermal treatment process on the bulk material 600 to further form the plurality of gettering sites within the cleave region 603. That is, the thermal treatment process anneals out and/or quenches the cleave region 603 to fix the plurality of first particles in place in a defect network. The thermal treatment provides a fixed network of defects that can act as efficient sites for gettering and accumulating particles in a subsequent and/or concurrent implantation process. In a specific embodiment, this process may be utilize CW and/or pulsed radiation heat 605 from above the surface region 601 and the heat conductance 607 from bottom to compensate for achieving the desired heat treatment temperature. Joule or inductive heating flow 608 can also be utilized. For example, the temperature control is performed with the apparatus 100.

In a specific embodiment, the process 260 of the method 200 further includes subjecting the surface region of the bulk material to a second plurality of high energy particles, as illustrated in the simplified diagram of FIG. 9. The second plurality of high energy particles 705 may be generated using an implant device, for example the implant device 140 in apparatus 100 which may include a linear accelerator. As shown, the method includes the second plurality of high energy particles 705, which are provided in the bulk material 700. The second plurality of high energy particles 705 are introduced into the cleave region 703, which increases a stress level of the cleave region from a first stress level to a second stress level. In a specific embodiment, the second stress level is suitable for a subsequent cleaving process. In a particular embodiment, the bulk material is maintained at a second temperature, for example in a range between about 20° C. and 500° C., which is higher than the first temperature. For example, the second temperature is controlled by the apparatus 100 and by performing processes 220, 230 and 240. Of course, the type of ion used and process conditions depend upon the application.

Using hydrogen as the species implanted into bulk single crystal silicon material in the second implantation step as an example, the implantation process is performed using a specific set of conditions. Implantation dose ranges from about $5\times10^{15}$ to about $5\times10^{16}$ atoms/cm$^2$, and preferably the dose is less than about $1\text{-}5\times10^{17}$ atoms/cm$^2$. Implantation energy ranges from about 1 MeV and greater to about 5 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about 250 Degree Celsius to about 550 Degrees Celsius, and is preferably greater than about 400 Degrees Celsius. The hydrogen ions can be selectively introduced into the silicon wafer to the selected depth at an accuracy of about ±0.03 to ±3 microns. In a specific embodiment, the temperature and dose are selected to allow for efficient conversion of mono-atomic hydrogen to molecular hydrogen within the cleave region, while there may be some diffusion of mono-atomic hydrogen. Of course, the type of ion used and process conditions depend upon the application.

Specific embodiments of the present method may use a mass-selected high-energy implant approach, which has the appropriate beam intensity. To be cost-effective, the implant beam current should be on the order of a few tens of milliamps of H$^+$ or H$^-$ ion beam current. If the system can implant sufficiently high energies, H$_2^+$ ions can also be advantageously utilized for achieving higher dose rates. Such ion implant apparatuses have been made recently available by the use of radio-frequency quadrupole linear accelerator (RFQ-Linac) or Drift-Tube Linac (DTL), or RF-Focused Interdigitated (RFI) technology. These are available from companies such as Accsys Technology Inc. of Pleasanton, Calif., Linac Systems, LLC of Albuquerque, N. Mex. 87109, and others.

Optionally, specific embodiments of the process 250 of the method 200 in accordance with the present invention further include a thermal treatment process after the implanting process. One particular embodiment uses a thermal process ranging from about 450 to about 600 Degrees Celsius for silicon material. In a preferred embodiment, the thermal treatment can be performed by at least partially performing temperature control processes 220, 230, and 240 of the method 200. Of course, there can be other variations, modifications, and alternatives.

Referring back to FIG. 5, the cleaving processes can occur within system 100 where once the surface temperature T$_s$ is reached to the set process temperature T$_p$, the process step 260 of the method 200 is performed to start the cleaving process. Of course there can be other variations, modifications, and alternatives.

Figure 11:
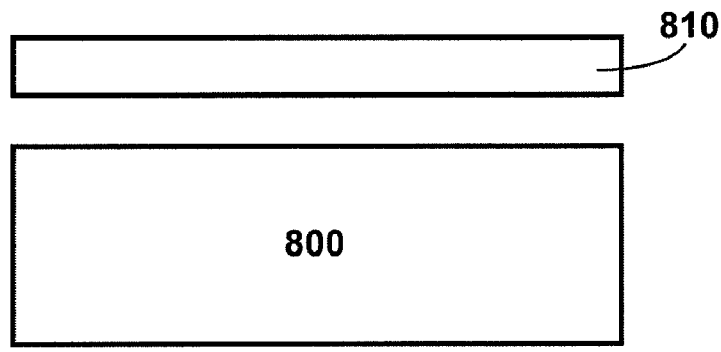

A specific embodiment of a method in accordance with the present invention includes a step of freeing the free-standing layer using a cleaving process, while the free-standing layer is free from a permanent overlying support member or the like, as illustrated by FIG. 11. As shown, the free-standing layer 810 is removed from the remaining bulk material 800. In a specific embodiment, the step of freeing can be performed using a controlled cleaving process. The controlled cleaving process provides a selected energy within a portion of the cleave region. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the free-standing thickness of the layer from the bulk material to completely remove the free-standing layer. Of course, there can be other variations, alternatives, and modifications.

Certain embodiments of the present invention may employ one or more patterned regions to facilitate initiation of a cleaving action. Such approaches may include subjecting the surface region of the semiconductor substrate to a first plurality of high energy particles generated from a linear accelerator, to form a patterned region of a plurality of gettering sites within a cleave region. In one embodiment of a method according to the present invention, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

Such a patterned implant sequence subjects the surface to a dose variation, where the initiation area is usually developed using a higher dose and/or thermal budget sequence. Propagation of the cleaving action to complete the cleaving action can occur using: (i) additional dosed regions to guide the propagating cleave front, (ii) stress control to guide a depth that is cleaved, and/or (iii) a natural crystallographic cleave plane. Some or most of the area may be implanted at a lesser dose (or not implanted at all) depending on the particular cleaving technique used. Such lower dosed regions can help improve overall productivity of the implantation system by reducing the total dose needed to detach each film from the substrate.

According to a specific embodiment, generation of the higher-dosed initiation area can be facilitated by the use of the implantation beam itself to simultaneously increase the area dose, while heating the region and preparing the region for localized film detachment. The detachment can be accomplished in-situ during the implantation beam process, or after implantation using a separate thermal process step. Use of a sensor to measure and feed back the state of the initiation region, may be helpful to allow precise and controlled localized film detachment and avoid overheating or damaging the layer immediately after cleaving has occurred.

Specific embodiments of the present invention can perform other processes. For example, the method can place the free-standing layer in contact with a support member, which is later processed. Additionally or optionally, a method in accordance with an embodiment of the present invention performs one or more processes on the bulk material before subjecting the surface region to the first plurality of high-energy particles. Depending upon the particular embodiment, the processes can be for the formation of photovoltaic cells, integrated circuits, optical devices, any combination of these, and the like. Of course, there can be other variations, modifications, and alternatives.

The thickness of the free-standing material may be varied from 15 microns or less to 200 microns in accordance with the embodiments of present invention. For example, cleavage of about 70% of the thickness of a silicon ingot utilizing techniques may produces 350 free-standing single crystal silicon films, each having a thickness of 100 um. As 1 m$^2$ represents about 45 tile surfaces having an area of 15 cm×15 cm, a total silicon surface area of about 7.8 m$^2$ can be produced from 70% of a 5 cm thick ingot. The thickness of the free-standing material is further processed to provide a high quality semiconductor material for application such as photovoltaic devices, 3D MEMS or integrated circuits, IC packaging, semiconductor substrate manufacturing, semiconductor devices, any combination of these, and others. One embodiment of the present method provides for single crystal silicon for highly efficient photovoltaic cells among others. Certain embodiments use a low initial dose of energetic particles, which allows the process to be cost effective and efficient.

Referring back to the FIG. 5, after each of the free-standing film is freed from the bulk material the process 270 of the method 200 may be carried out, particularly for producing one or more free-standing films in production mode. This process includes reading the position sensor data to determine if the remaining bulk material is less than 30% of original bulk material. It also is translated to detect the length of the remaining bulk material and compare with the stored original length. Once the sensor reading indicates the length of remaining bulk material is less than 30%. The controller can send signals to command ending the process, followed by removing the remaining bulk material. The remaining 30% of the bulk material not cleaved can be returned to the melt as highly purified starting material to produce a fresh bulk material for cleaving. If the position sensor reading indicates that the remaining bulk material length is more than 30%, the method 200 leads to the next process step with the remaining bulk material. In another specific embodiment, the position sensor may partially provide a new input data related to the thermal capacity of the remaining bulk material. The new input data can be processed to determine the updated control routine for the next process step.

The next process step 280 of the method 200 includes checking more sensor data related to the remaining bulk material, which is also related to the application of the method to manufacture one or more free-standing films in production mode. In this process step, surface roughness of the surface region of the remaining bulk material is inspected. The process 280 includes utilizing one or more in-situ probes to measure the surface roughness of the remaining bulk material. The measured surface roughness parameter (or other properties including surface defects) may be compared with predetermined criterion. In one embodiment, at the process 280 the criterion may be met, indicating also the quality of the cleaved film is acceptable and the remaining bulk material may be capable of being applied with a new cleaving process cycle. The process flow of the method 200 may be set back to the process step 220, followed by the processes 230, 240, 250, and 260 again.

In another embodiment, at the process 280 the criterion may not be met, indicating that the surface after cleaving may need to be repaired or the bulk material needs to be re-prepared. The process flow now thus, at least partially, may be set back to the process step 210 where a surface treatment for the remaining bulk material may be applied. In one example, which may be relatively high cost, the surface is performed a re-lapping and/or re-polishing treatment, i.e., the process flow is fully reset to process 210. In another example, a less cost process such as using the ion beam with a increasing dose, or performing an etching of the surface, or adding a thin smoothing layer by spin-on deposition, etc. may be performed to collapse the surface roughness until the criterion is met.

Figure 12:
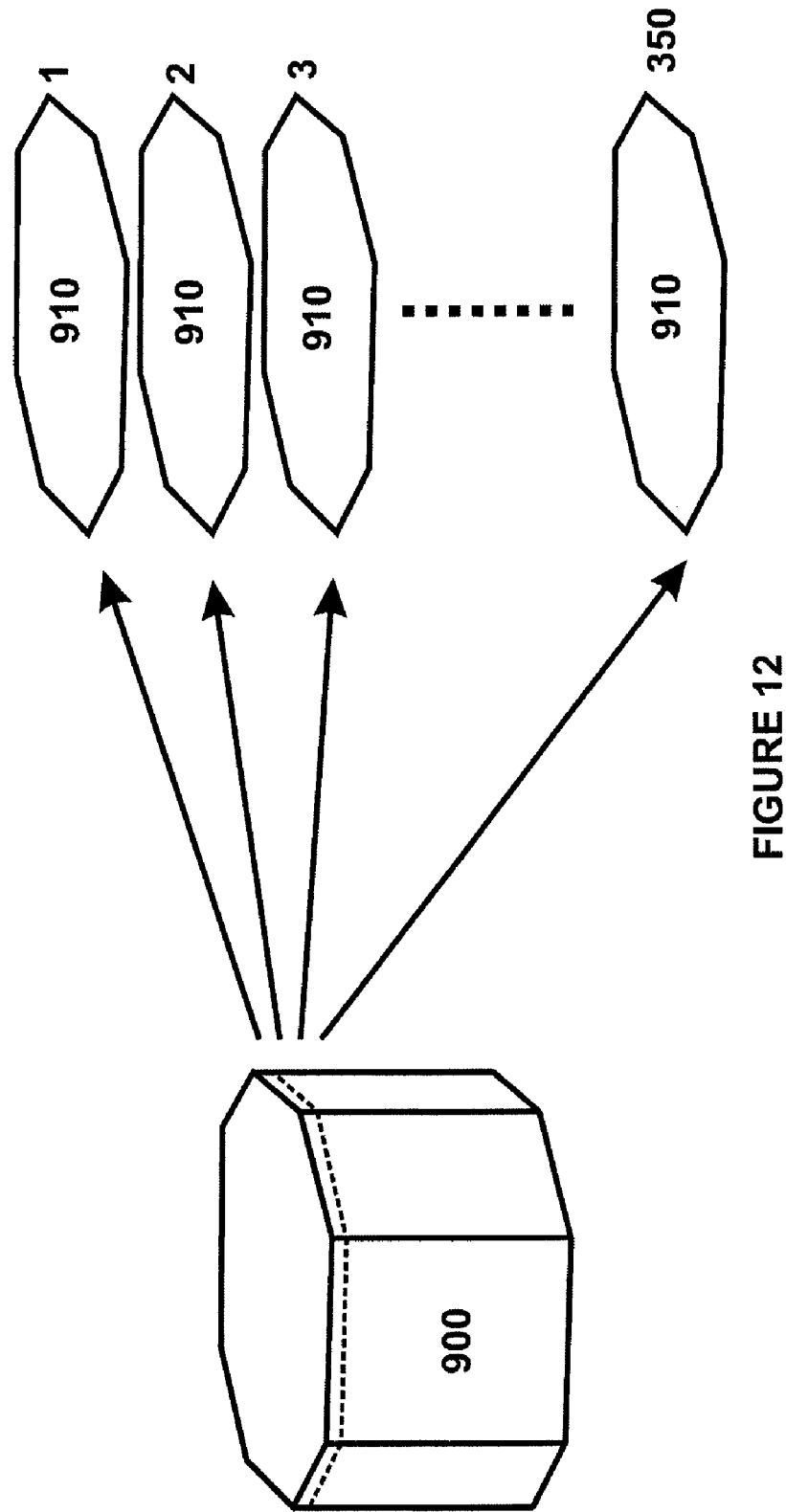
FIG. 12 shows a simplified view of a plurality of free-standing thick films being removed from a bulk material in accordance with an embodiment of the present invention.

FIG. 12 shows a simplified schematic view of the formation of a plurality of free-standing films out of a bulk material in accordance with one embodiment of the present invention. Single crystal silicon ingot 900 exhibits an original thickness of 5 cm and has lateral dimensions of 15 cm×15 cm. As the density of single crystal silicon is about 2.32 gm/cm$^3$, the weight of this bulk single crystal silicon material is 15×15× 5×2.32=2.61 Kg. Thus, cleavage of about 70% of the thickness of such ingot 900 utilizing techniques according to embodiments of the present invention, produces 350 free-standing single crystal silicon films 910, each having a thickness of 100 µm. As 1 m$^2$ represents about 45 tile surfaces having an area of 15 cm×15 cm, a total silicon surface area of about 7.8 m$^2$ can be produced from 70% of a 5 cm thick ingot. The remaining 30% of the ingot not cleaved to form single crystal silicon, can be returned to the melt as highly purified starting material to produce a fresh ingot for cleaving.

In accordance with an alternative embodiment of the present invention, a seed layer may further provide for layering of a hetero-structure epitaxial process. The hetero-structure epitaxial process can be used to form thin multi junction photovoltaic cells, among others. Merely as an example, GaAs and GaInP layers may be deposited heteroepitaxially onto a germanium seed layer, which is a free-standing layer formed using an implant process according to an embodiment of the present invention.

While the above is a full description of the specific embodiments, various modifications, alternative constructions, and equivalents may be used. For example, while the preceding embodiments above show the bulk material in direct contact with a temperature control stage, this is not required by the present invention. In accordance with alternative embodiments, a bottom portion of the bulk material could be secured to an adapter or interface plate intermediate between the bulk material and the temperature control stage.

Figure 13A:
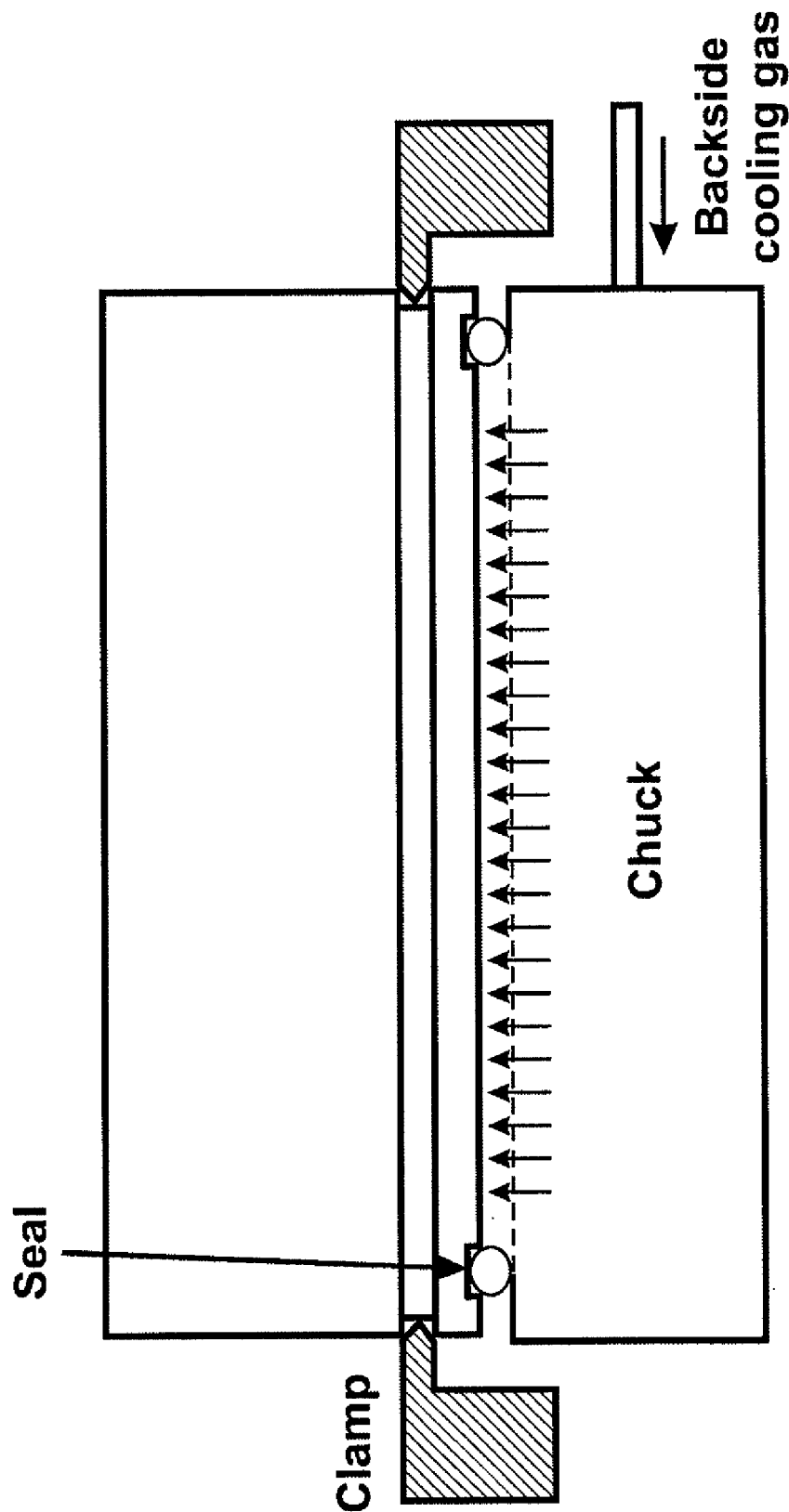
FIGS. 13A-E show various approaches to securing a bulk material to a temperature control stage taken by embodiments of the present invention.

FIGS. 13A-E show various approaches to securing a bulk material to a temperature control stage taken by embodiments of the present invention. The embodiment of FIG. 13A is analogous to that previously described, wherein the bottom portion of the bulk material is secured in direct contact with an o-ring of a temperature control chuck, utilizing a clamp engaging with a notch in the side of the bulk material.

Figure 13B:
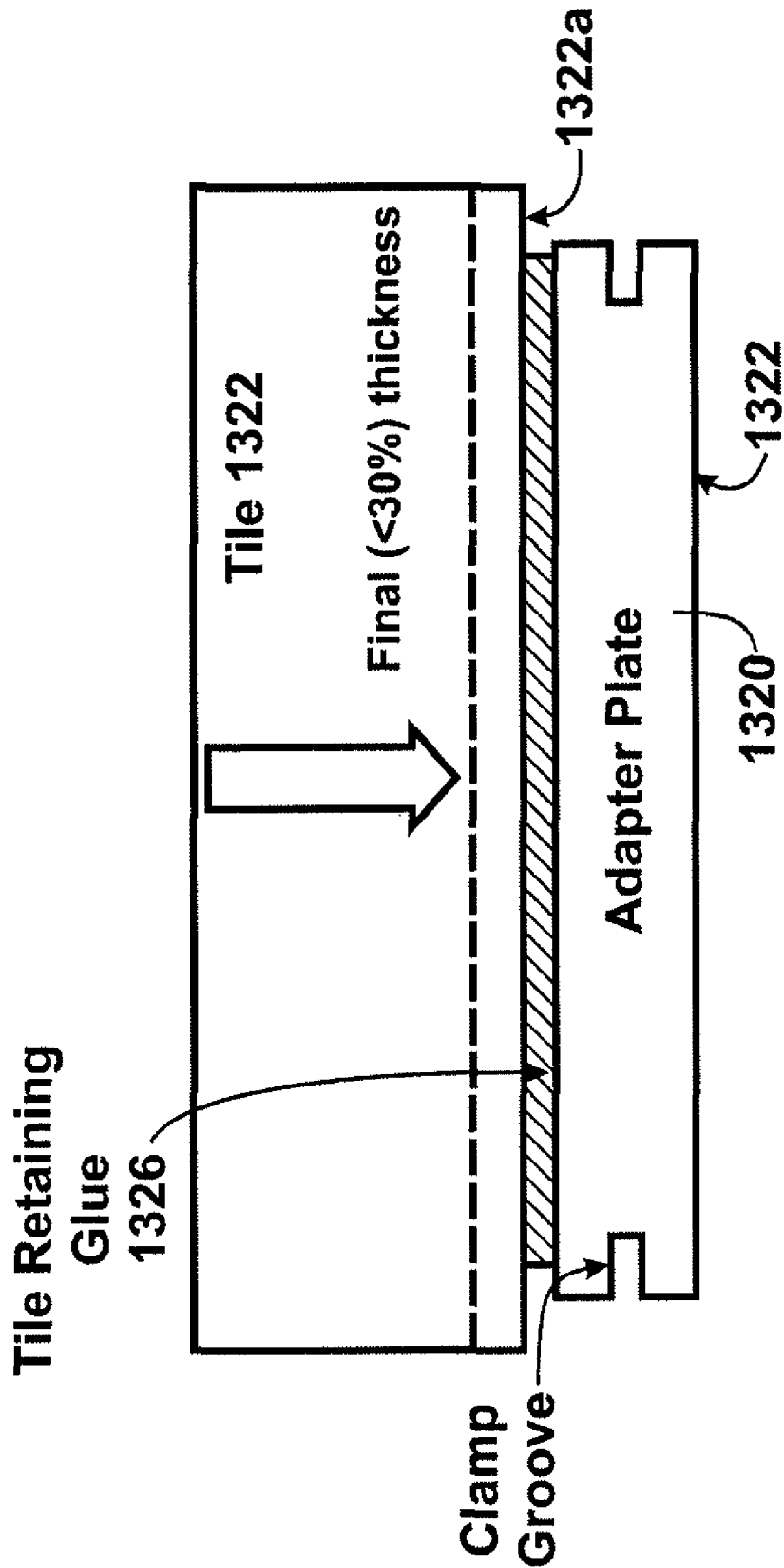

By contrast, the embodiment of FIG. 13B utilizes an adapter plate 1320 that is secured a lower surface 1322a of a tile (bulk material) 1322 utilizing a tile retaining glue 1326. In this particular embodiment, the adapter plate is slightly smaller than the surface area of the bottom of the tile, but this is not required. In alternative embodiments, the adapter plate could be the same size as, or even bigger than, the bottom surface of the tile.

The particular embodiment of FIG. 13B also shows the adapter plate having a notch 1328. This is also not required, and the adapter plate need not have such a notch.

Figure 13C:
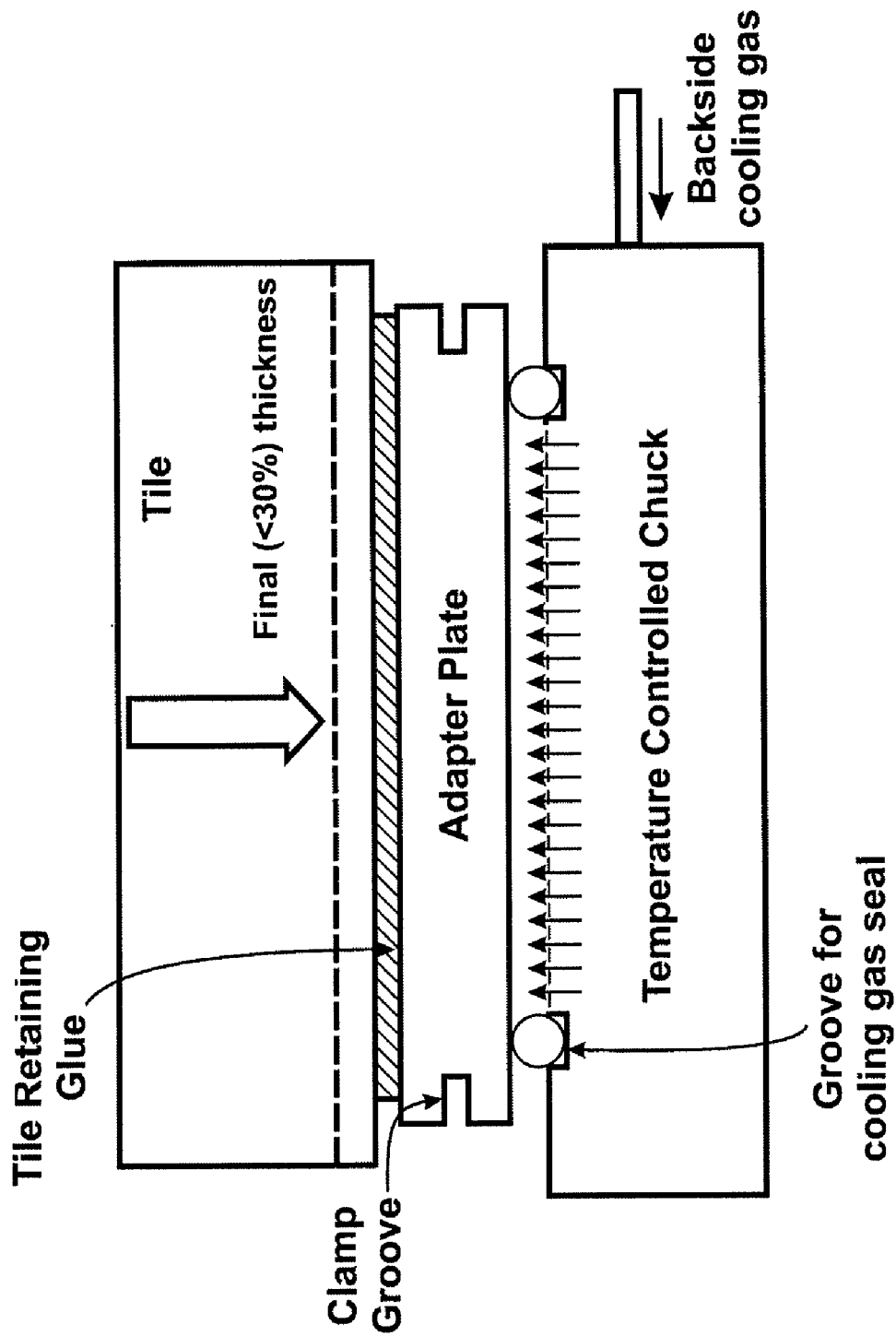

FIG. 13C shows the tile-adapter plate configuration of FIG. 13B, secured to a temperature controlled chuck. Specifically, the adapter face opposite that in contact with the tile, is sealed against an o-ring positioned in a recess of the temperature controlled chuck. The temperature controlled chuck is configured to expose a backside of the adapter to a cooling gas, thereby controlling its temperature and a temperature of the tile in contact therewith.

Depending on the environment of the adapter plate, different adapter clamping can be used. For example, atmospheric applications could allow the use of vacuum chucking. In the particular embodiment of FIG. 13C, the adapter is maintained in contact with the chuck through suction only, as no clamp is shown engaged with the clamp groove of the adapter. In other embodiments, however, a clamp could engage with the clamp groove of the adapter to ensure secure contact between the adapter and temperature control stage. In accordance with still other embodiments, the adapter plate could be secured to the temperature control chuck utilizing an applied vacuum or electrostatic forces.

Figure 13D:
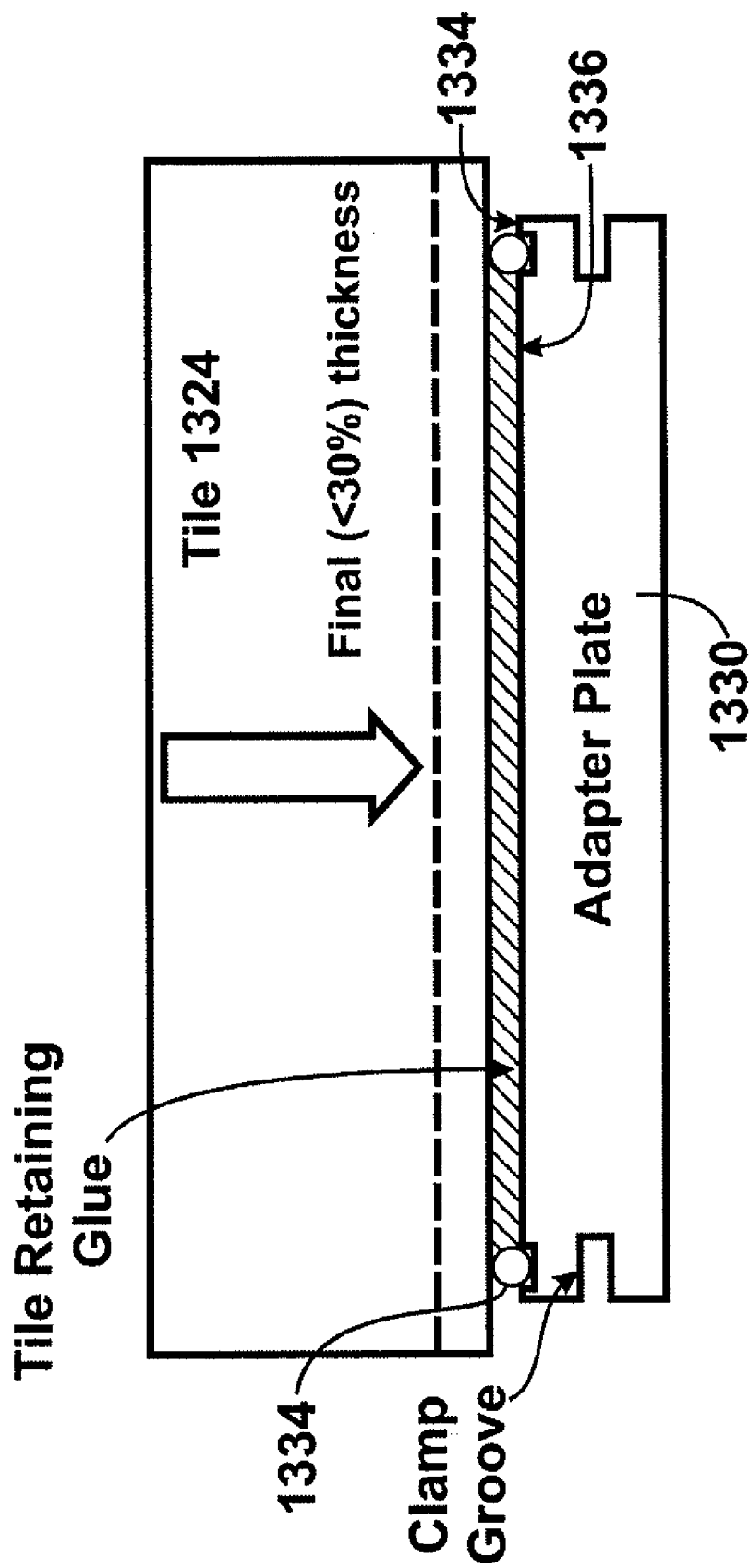

FIG. 13D shows a simplified cross-sectional view of still another configuration in accordance with the present invention, wherein surface 1330a of adaptor plate 1330 facing the tile 1324, includes a recess 1332 configured to receive an o-ring 1334. Recess 1332 is positioned inside edge region 1334, and encloses interior region 1336. In this embodiment, recess 1332 serves not only to hold the o-ring in place, but also serves to confine any spread of the tile retaining glue within the interior region 1336, when the tile and adapter plate are bonded together.

Figure 13E:
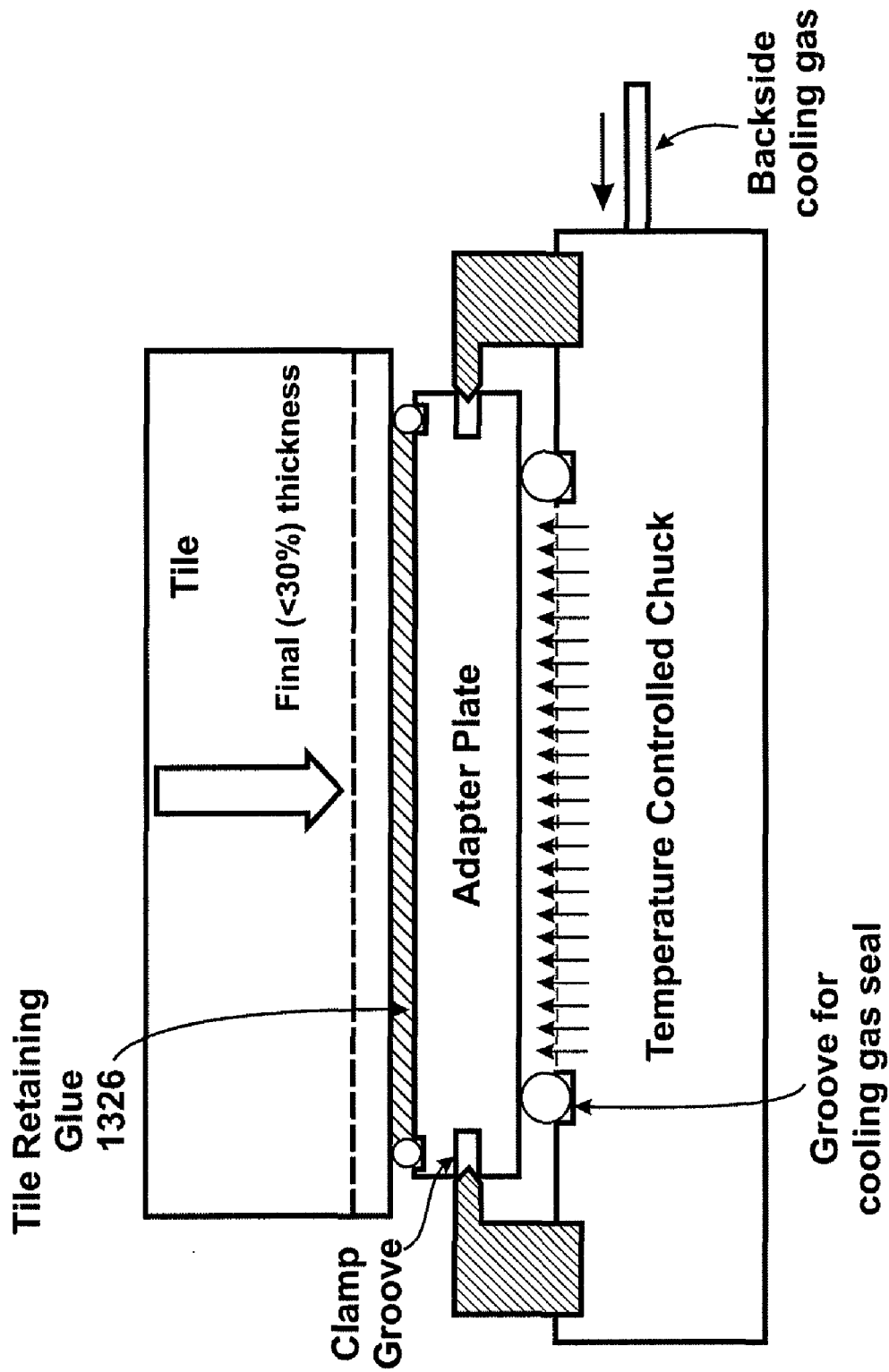

FIG. 13E shows the tile-adapter plate configuration of FIG. 13D, secured to a temperature controlled chuck. Specifically, the face of the adapter opposite that which is in contact with the tile, is sealed against an o-ring positioned in a recess of the temperature controlled chuck. The temperature controlled chuck is configured to expose a backside of the adapter to a cooling gas, thereby controlling its temperature as well as a temperature of the tile that is in contact with the adapter plate.

In the particular embodiment of FIG. 13E, the adapter is maintained in contact with the chuck utilizing a clamp configured to engage with the clamp groove that is located in the side of the adapter plate. This is not required by the present invention, however, and in alternative embodiments the adapter plate could be secured to the temperature control chuck utilizing other approaches, for example an applied vacuum or electrostatic force.

Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. Another form of co-implantation involves substituting deuterium instead of hydrogen in one or more of the implant sub-steps. Deuteron implantation into silicon at 1-10 MeV produces about 3 times more atomic displacements and thus may be more efficient in forming the plurality of gettering sites within the cleave region 603 in FIG. 9. Of course there can be other variations, modifications, and alternatives. For example, the second accumulation implant can be substituted by a hydrogenation or deuteration step where getter region accumulation by hydrogen or deuterium occurs by a diffusion process. Therefore, the above description and illustrations should not be taken as limiting the scope of the present invention which is defined by the appended claims.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for temperature control during a process of cleaving a plurality of free-standing thick films from a bulk material, the method comprising:
    providing a bulk material for cleaving, the bulk material having a surface region, a bottom region, a side region having a length from the surface region to the bottom region;
    clamping the bulk material using a mechanical clamp device adapted to engage the bottom region of the bulk material through a seal with a planar surface of a stage to form a cavity with a height between the bottom region and the planar surface, the planar surface comprising a plurality of gas passageways allowing a gas filled in the cavity with adjustable pressure;
    sensing the state of the bulk material to generate an input data, the input data comprising temperature information at the surface region and the bottom region and the length of the bulk material between the surface region and the bottom region;
    maintaining the temperature of the surface region by processing at least the input data and executing a control scheme utilizing at least one or more of;
    particle bombardment to heat the surface region;
    radiation to heat the surface region; and
    gas-assisted conduction between the bottom region and the stage.

2. The method of claim 1 wherein the stage further comprises inductive heating of the bulk material in the control scheme.

3. The method of claim 1 wherein the bulk material comprises at least one of single crystalline silicon or germanium ingot, polycrystalline silicon tile, multi-crystalline silicon tile, and compound semiconductor ingot or tile.

4. The method of claim 1 wherein the bulk material is preprocessed to planarize the surface region for facilitating the cleaving process.

5. The method of claim 1 wherein the clamping of the bulk material by the mechanical clamp device is performed such that the surface region and at least 70% of the bulk material from the surface region are substantially exposed for cleaving thick films without interference of the clamp device.

6. The method of claim 5 wherein the mechanical clamp is a part of a robot capable of performing removable clamping.

7. The method of claim 5 wherein the mechanical clamp also electrically connects to the bulk material to heat the bulk material through Joule heating.

8. The method of claim 5 wherein the seal is gas-tight and secured enough to sustain gas pressure up to 300 Torr in the cavity.

9. The method of claim 8 wherein the seal comprises an O-ring or a dielectric flange or a metal flange.

10. The method of claim 8 wherein the gas supplied in the cavity comprises at least one gas of hydrogen, helium, argon, or nitrogen.

11. The method of claim 8 wherein the gas supplied in the cavity can be a cryogenic gas, room temperature gas, or a heated gas.

12. The method of claim 1 wherein the planar surface of the stage comprises an area and shape substantially the same as the bottom region of the bulk material.

13. The method of claim 12 wherein the stage is an electrostatic chuck capable of generating electrostatic force to attract the bulk material.

14. The method of claim 12 wherein the stage further comprises a fluid temperature control unit attached to its bottom.

15. The method of claim 14 wherein the fluid temperature control unit utilizes a liquid or gas for cooling or heating the bulk material through the stage.

16. The apparatus of claim 1 wherein the stage and the mechanical clamp device are both mounted on a tray that allows X-Y two dimensional move.

17. The method of claim 1 wherein sensing the state of the bulk material comprising using a plurality of sensors including temperature sensor, position sensor, pressure sensor, and/or surface roughness probe.

18. The method of claim 17 wherein the temperature sensor comprises one or more optical pyrometers or thermocouples performing temperature measurement.

19. The method of claim 17 wherein the position sensor is capable of tracking the length of the bulk material after each free-standing thick film being removed from the bulk material by the progressive cleaving process.

20. The method of claim 17 wherein the surface roughness probe is capable of performing in-situ measurement of a roughness value of the surface region after cleaving each free-standing thick film from the bulk material.

21. The method of claim 20 wherein the cleaving process may continue, if the roughness parameter meets a pre-set criterion; otherwise, the cleaving process is paused for repairing the surface region.

22. The method of claim 21 wherein the surface region of the bulk material is repaired at least by one process of ion particle bombardment, etching, or depositing a smooth layer on the surface region.

23. The method of claim 1 wherein the utilizing radiation to heat the surface region comprising using an external radiant heat source located above the surface region.

24. The method of claim 23 wherein the radiant heat source comprises a plurality of flash lamps with a controlled power supply, pulse rate, and spatial distribution.

25. The method of claim 23 wherein the external radiant heat source comprises one or more sources with slowly varying thermal power flux rate to heat the surface region of the bulk material with a less than 20° C. surface-to-bottom temperature difference.

26. The method of claim 23 wherein the external radiant heat source comprises one or more sources with rapidly varying thermal power flux rate to heat the surface region of the bulk material faster than a thermal conduction time constant for the surface region.

27. The method of claim 26 wherein the source with rapidly varying thermal power flux rate is a pulsed laser.

28. The method of claim 27 wherein the pulsed laser is a YAG or YLF Q-switched laser.

29. The method of claim 1 wherein the utilizing particle bombardment to heat the surface region comprising using a power flux from an ionic particle beam generated by an implant device.

30. The method of claim 29 wherein the power flux from an ionic particle beam can be adjusted by changing a duty factor of the implant device.

31. The method of claim 30 wherein the duty factor can be adjusted by an electromagnetic scanning device.

32. The method of claim 1 wherein the utilizing the gas-assisted conduction between the bottom region and the stage to cool the bottom region comprising adjusting the gas pressure in the cavity to control the thermal power transfer.

33. The method of claim 1 wherein the cavity height may range from 3 microns to 200 microns.

34. The method of claim 1 wherein the cleaving process to progressively remove one or more free-standing thick films from the bulk material comprising introducing a first plurality of particles to form a defect region within a vicinity of a cleave region at a first temperature and introducing a second plurality of particles into the defect region at a second temperature to cause an increase of stress of the cleave region from a first value to a second value.

35. The method of claim 34 wherein the first plurality of particles comprises at least one species of hydrogen, deuterium, or helium.

36. The method of claim 35 wherein the first plurality of particles are provided at a dose of $8 \times 10^{16}$ per $cm^2$ and less.

37. The method of claim 34 wherein the second plurality of particles comprises at least one species of hydrogen, deuterium, or helium.

38. The method of claim 34 wherein the second plurality of particles are provided at a dose of $5 \times 10^{16}$ per $cm^2$ and less.

39. The method of claim 34 wherein the introducing of the plurality of particles is provided using a linear accelerator process, the linear accelerator process comprising using a plurality of radio frequency quadrupole (RFQ) elements and a plurality of drift tube linear accelerator (DTL) elements or a combination of both to confine and accelerate said particles.

40. The method of claim 39 wherein the plurality of particles are provided in an energy ranging from 1 MeV to 5 MeV.

41. The method of claim 34 further comprising a treatment process after introducing the first plurality of particles and before introducing the second plurality of particles, the treatment process comprising a thermal process provided at a temperature of 400 Degree Celsius or higher to render the defect region to be close to the cleave region and stabilize the defect region.

42. The method of claim 34 wherein the first temperature ranges from about −100 Degree Celsius to about 250 Degree Celsius.

43. The method of claim 34 wherein the first temperature is less than about 250 Degree Celsius.

44. The method of claim 34 wherein the second temperature is greater than about 250 Degree Celsius and no greater than 550 Degrees Celsius.

45. The method of claim 1 wherein the cleaving process to progressively remove one or more free-standing thick films from the bulk material further comprising repeatedly producing a plurality of free-standing thick films of the bulk material with a thickness greater than about 15 microns and less than 200 microns.

46. The method of claim 45 wherein the cleaving process is a thermal cleaving process to remove the film.

47. The method of claim 45 wherein the cleaving process is a controlled cleaving process (CCP) utilizing vertical thermal gradient to remove the film.

48. The method of claim 47 wherein the vertical thermal gradient is made using one or more of a group comprising a pulsed laser system, a pulsed flash lamp, a pulsed ion beam, convection heat transfer generated, and conduction heat transfer generated.

49. The method of claim 45 wherein the cleaving process is a controlled cleaving process (CCP) utilizing horizontal temperature/strain gradient to remove the film.

50. The method of claim 1 wherein the cleaving process to progressively remove one or more free-standing thick films from the bulk material further comprising using implant dose gradients to cause the cleaving preferentially starting at the higher dose.

51. The method of claim 50 wherein the ion implant source may also be used to create a patterned implant having a high dose region configured to initiate cleaving alone or upon exposure to additional energy.

52. The method of claim 1 wherein the cleaving process to progressively remove one or more free-standing thick films from the bulk material further comprising performing surface treatment on the free-standing thick film to remove surface cracks and reduce the surface roughness of the remaining bulk material.

53. The method of claim 1 wherein the particle bombardment creates a patterned implant having portions of sufficiently high dose to initiate cleaving alone or upon application of thermal energy.

54. The method of claim 1 wherein the mechanical clamp engages a groove in a homogenous portion of the bulk material, or engages a groove in an adapter plate in contact with the homogenous portion.

* * * * *